(12) United States Patent
Tews et al.

(10) Patent No.: US 7,816,792 B2
(45) Date of Patent: Oct. 19, 2010

(54) SEMICONDUCTOR DEVICE WITH CONDUCTIVE INTERCONNECT

(75) Inventors: Helmut Tews, Munich (DE); Hans-Gerd Jetten, Hoehenkirchen (DE); Hans-Joachim Barth, Munich (DE)

(73) Assignee: Infineon Technologies AG, Neubiberg (DE)

( * ) Notice: Subject to any disclaimer, the term of this patent is extended or adjusted under 35 U.S.C. 154(b) by 7 days.

(21) Appl. No.: 11/855,170

(22) Filed: Sep. 14, 2007

(65) Prior Publication Data

US 2009/0072411 A1 Mar. 19, 2009

(51) Int. Cl.
*H01L 23/48* (2006.01)
(52) U.S. Cl. ..................... 257/776; 257/773
(58) Field of Classification Search ................. 257/773, 257/776
See application file for complete search history.

(56) References Cited

U.S. PATENT DOCUMENTS

| | | | |
|---|---|---|---|
| 5,834,825 A | 11/1998 | Imai | |
| 7,061,123 B1 | 6/2006 | Chee et al. | |
| 7,300,824 B2 | 11/2007 | Sheats | |
| 7,429,779 B2 * | 9/2008 | Itoi et al. | 257/528 |
| 7,498,656 B2 * | 3/2009 | Zhang et al. | 257/531 |
| 2006/0181385 A1 | 8/2006 | Hurley | |
| 2007/0040258 A1 * | 2/2007 | Sheats | 257/686 |
| 2007/0284726 A1 * | 12/2007 | Lin et al. | 257/698 |
| 2008/0308917 A1 * | 12/2008 | Pressel et al. | 257/676 |
| 2009/0072388 A1 | 3/2009 | Tews et al. | |

* cited by examiner

*Primary Examiner*—David Vu
*Assistant Examiner*—Brandon Fox
(74) *Attorney, Agent, or Firm*—Infineon Technologies; Philip H. Schlazer

(57) ABSTRACT

One or more embodiments are related to a semiconductor structure, comprising: a semiconductor chip; a conductive layer comprising at least a first conductive pathway and a second conductive pathway spacedly disposed from the first conductive pathway, the first conductive pathway electrically coupled to the chip, at least a portion of the first conductive pathway disposed outside the lateral boundary of the chip, at least a portion of the second conductive pathway disposed outside the lateral boundary of the chip; and a conductive interconnect disposed outside the lateral boundary of the chip, the conductive interconnect electrically coupling the first conductive pathway to the second conductive pathway.

16 Claims, 21 Drawing Sheets

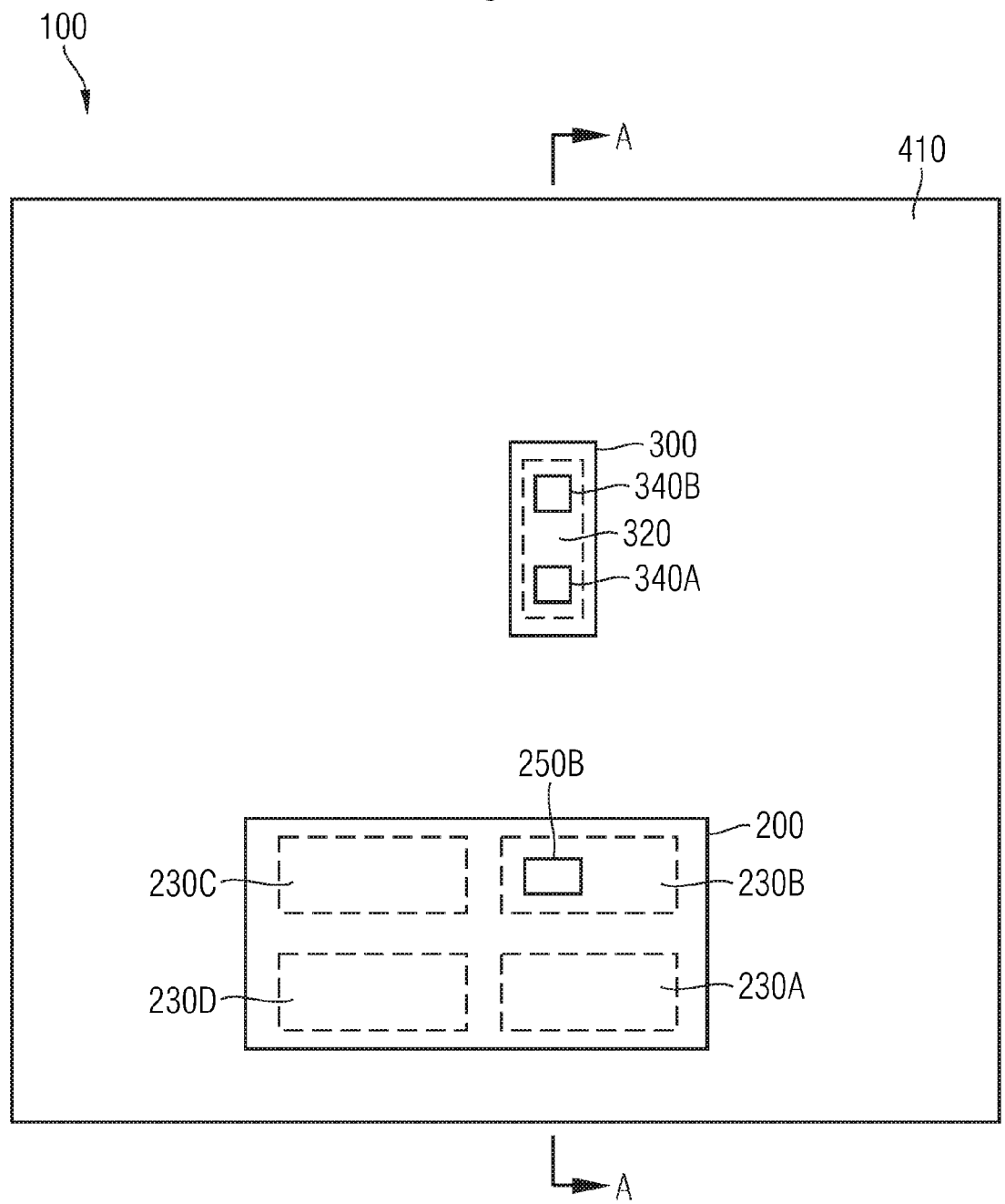

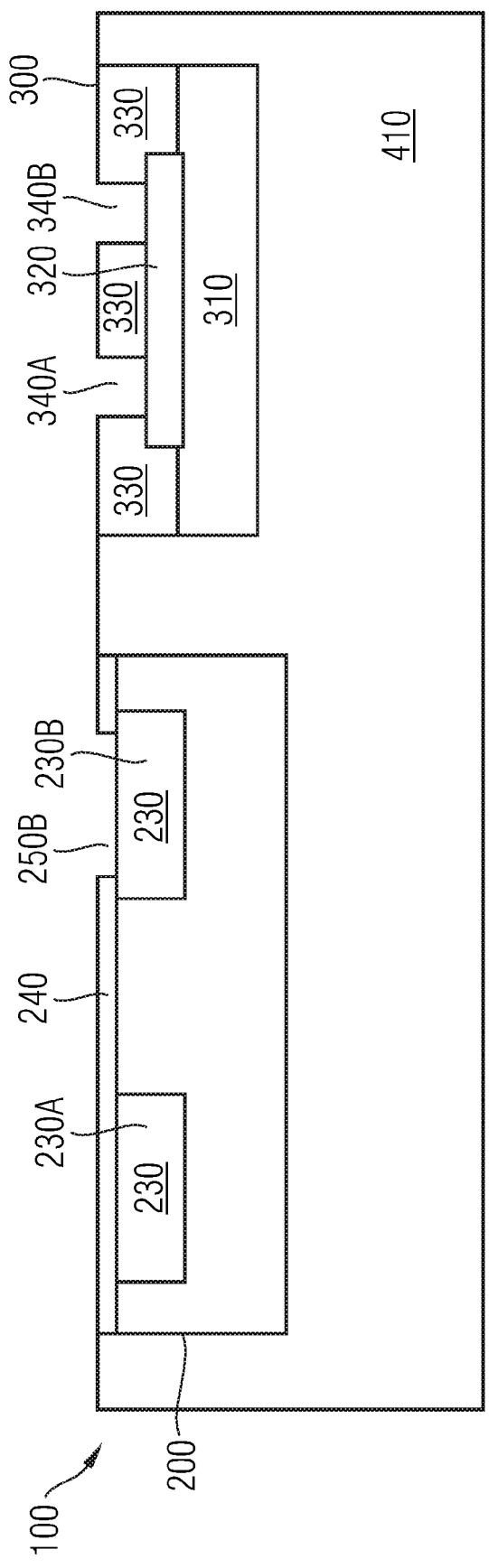

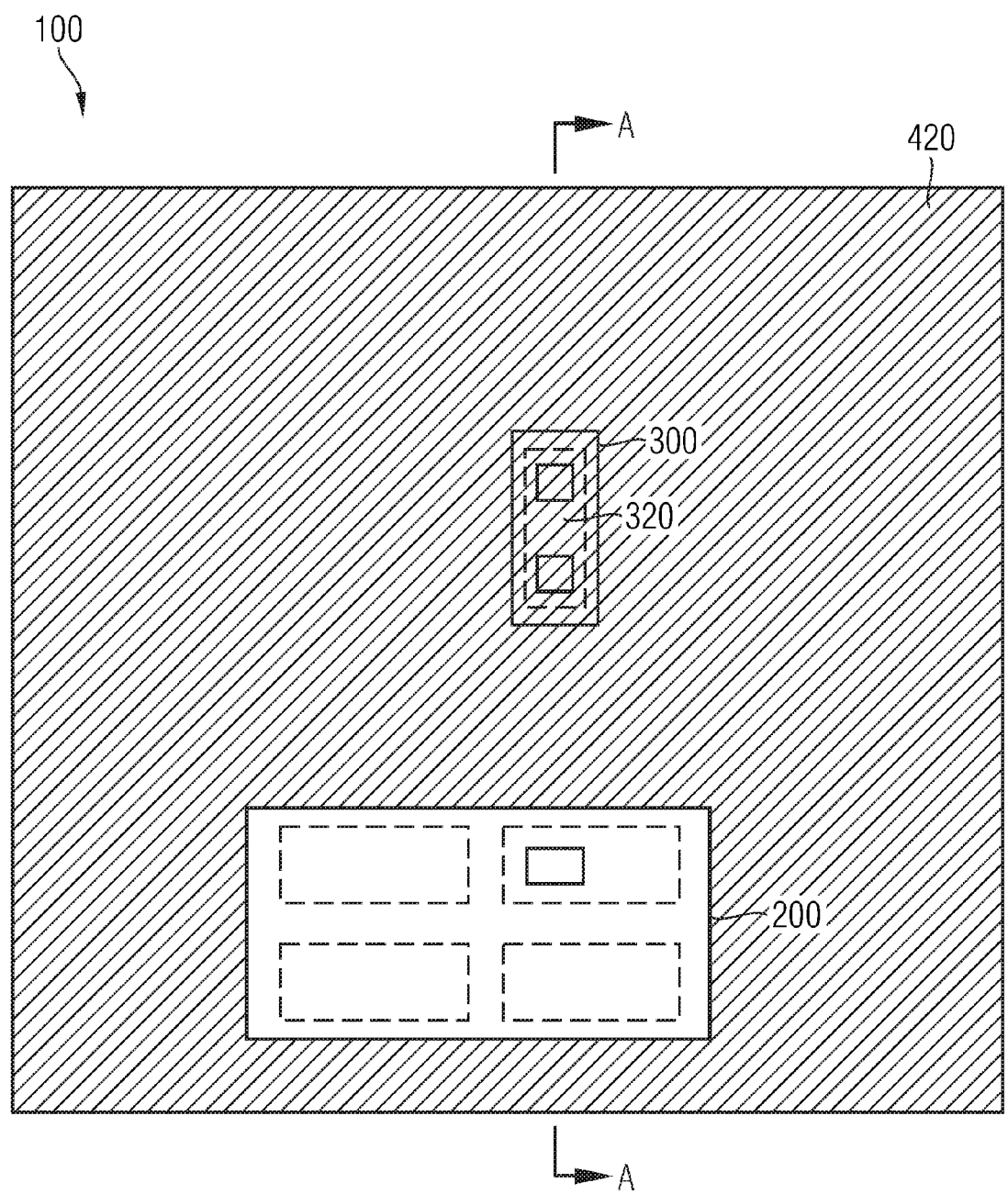

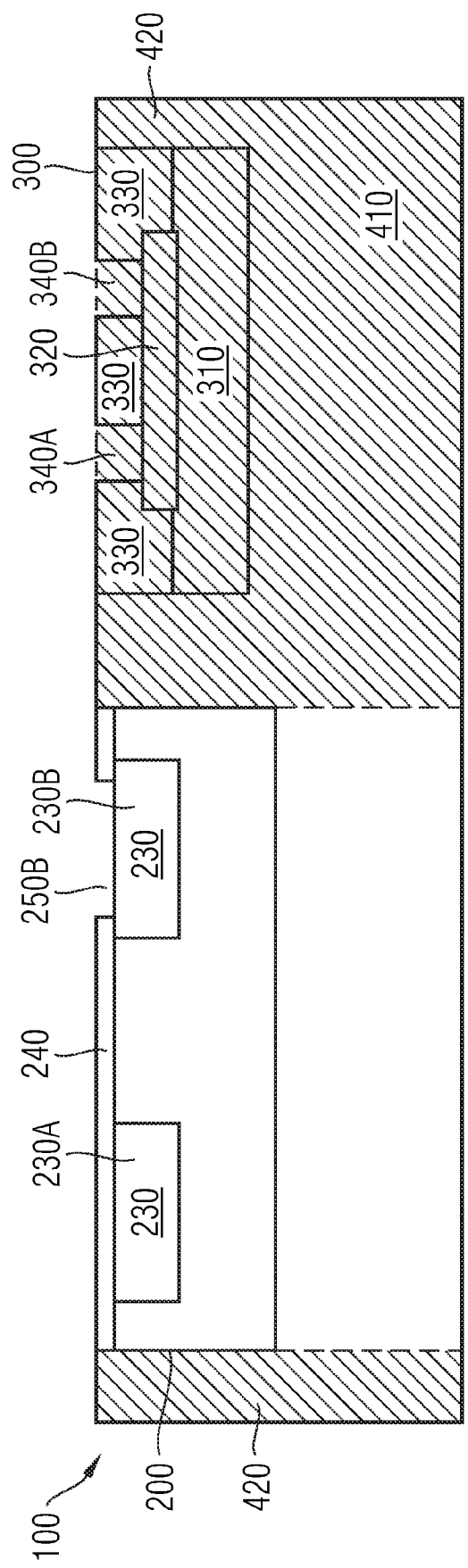

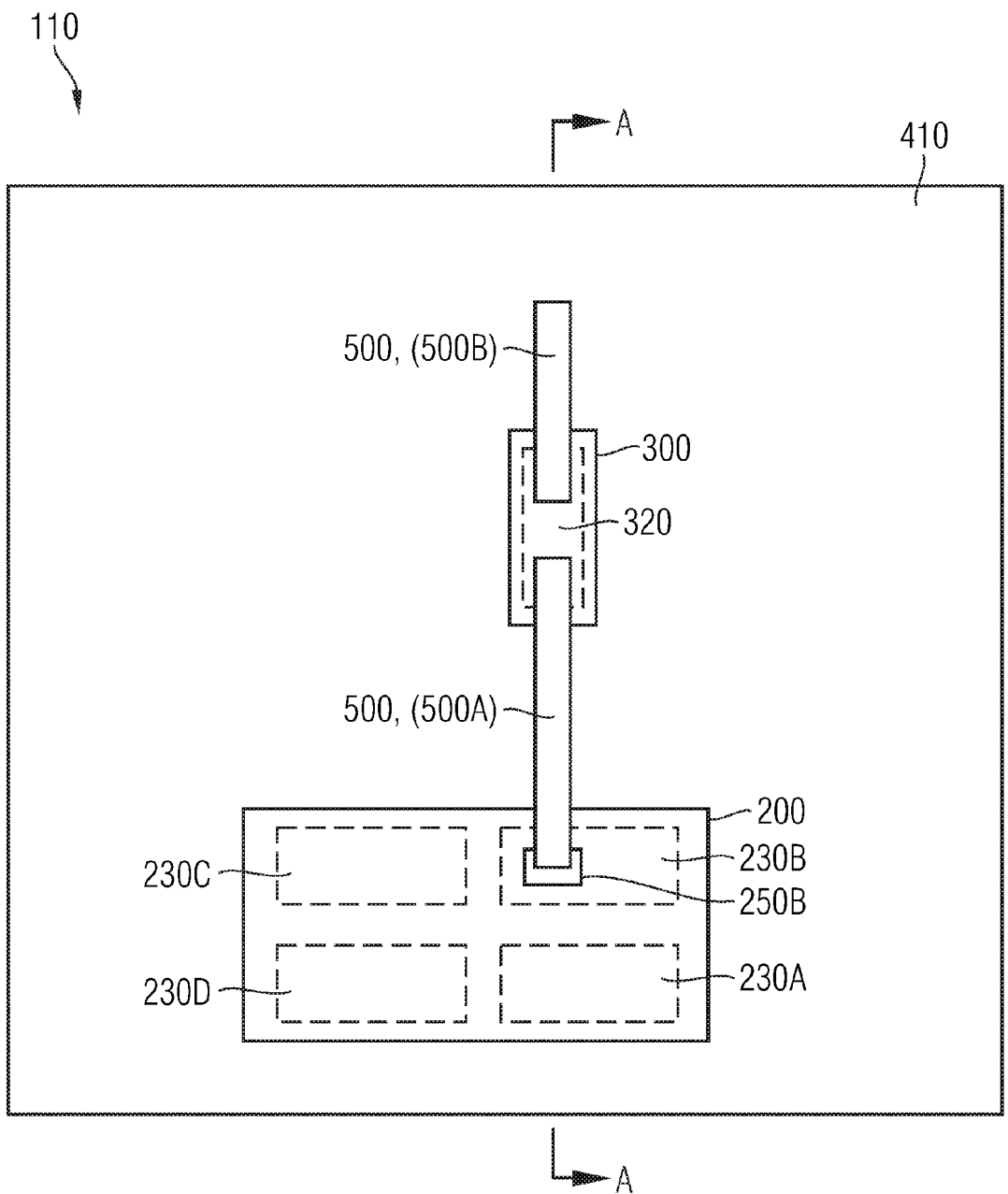

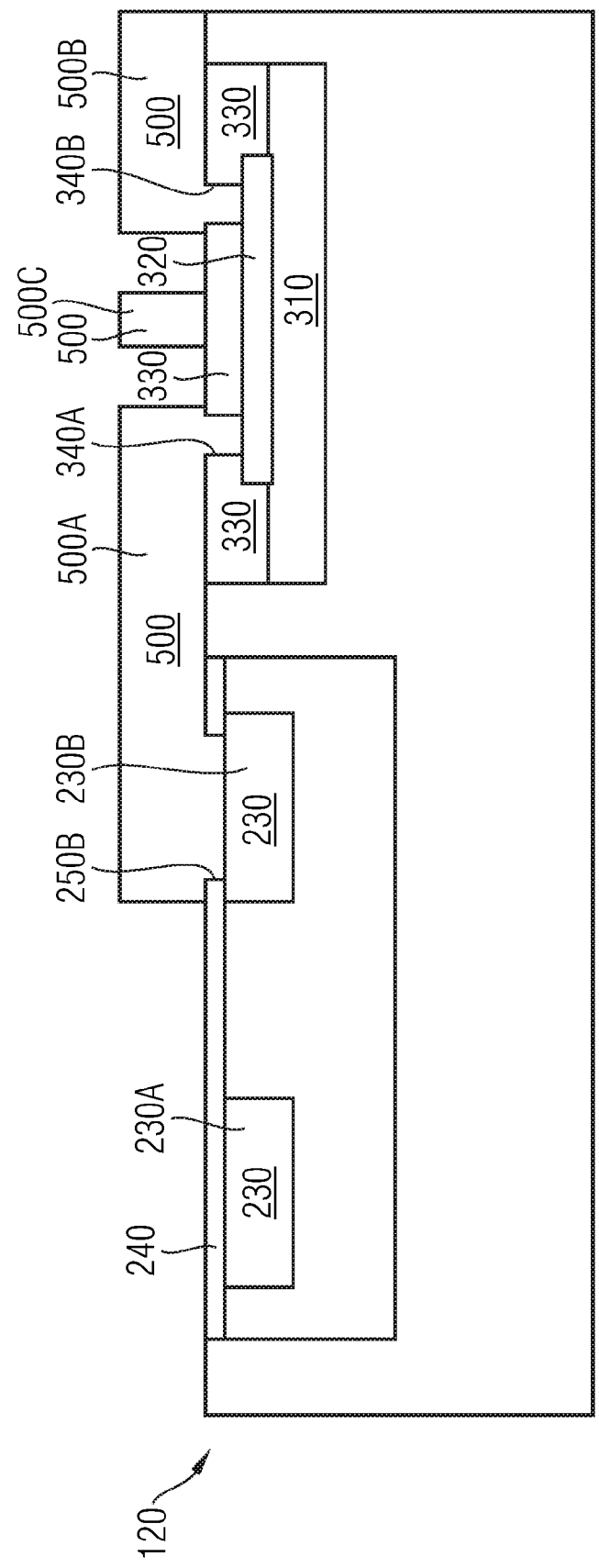

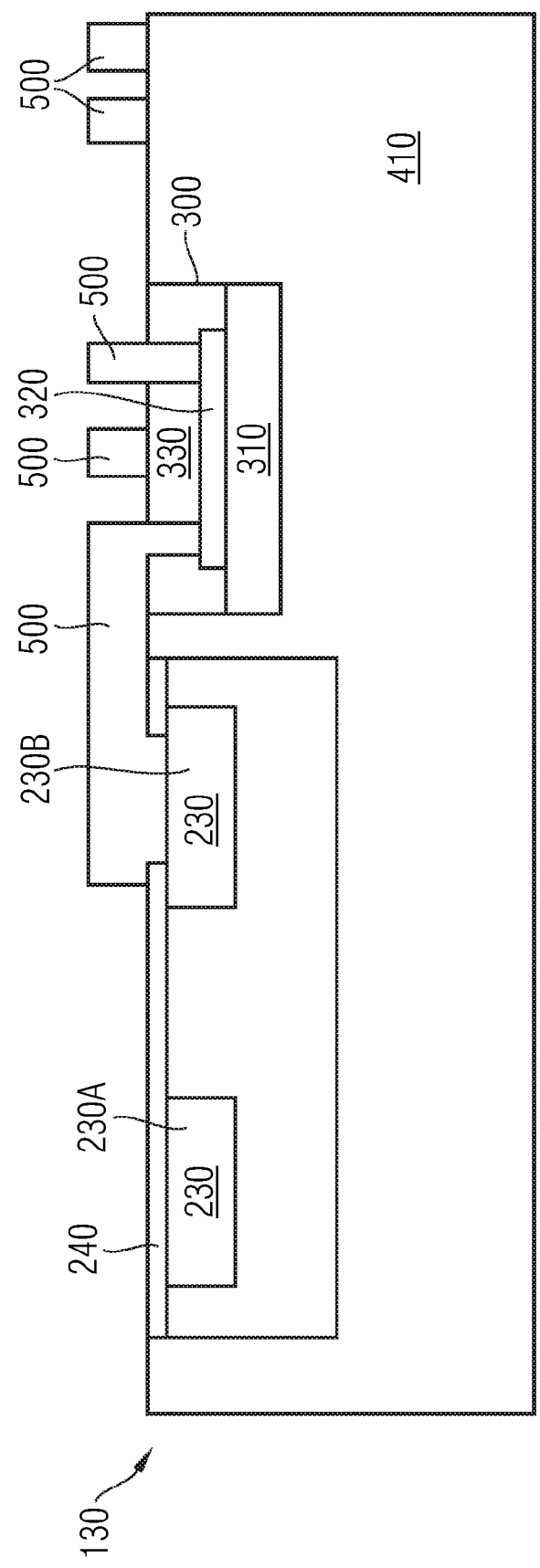

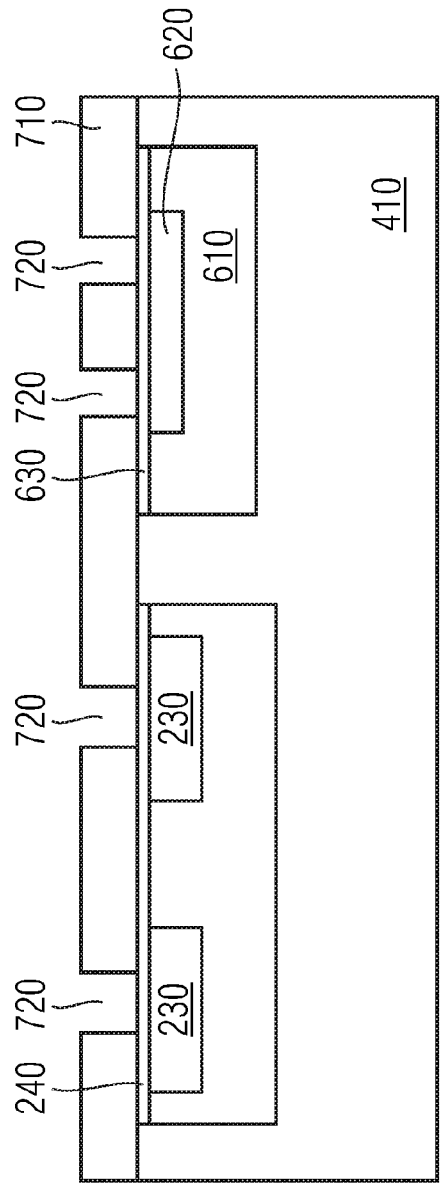
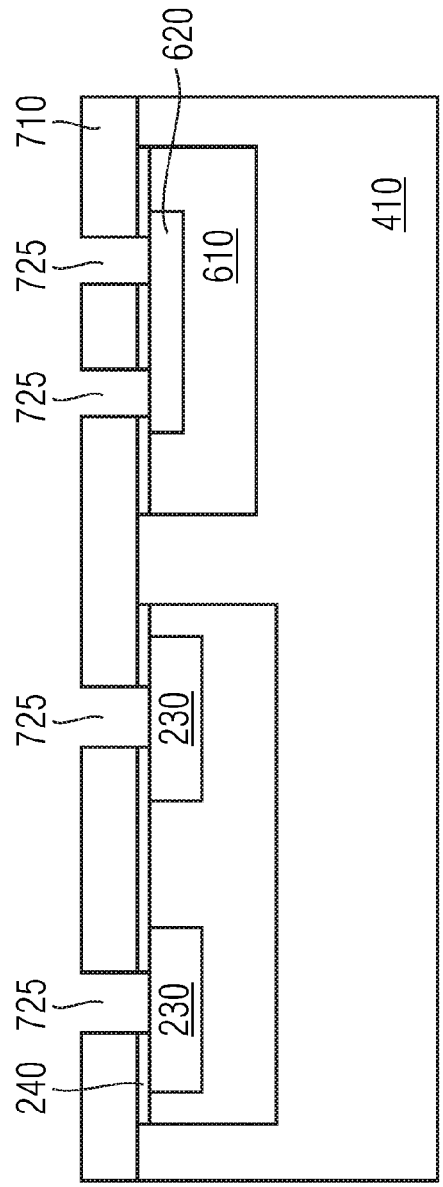

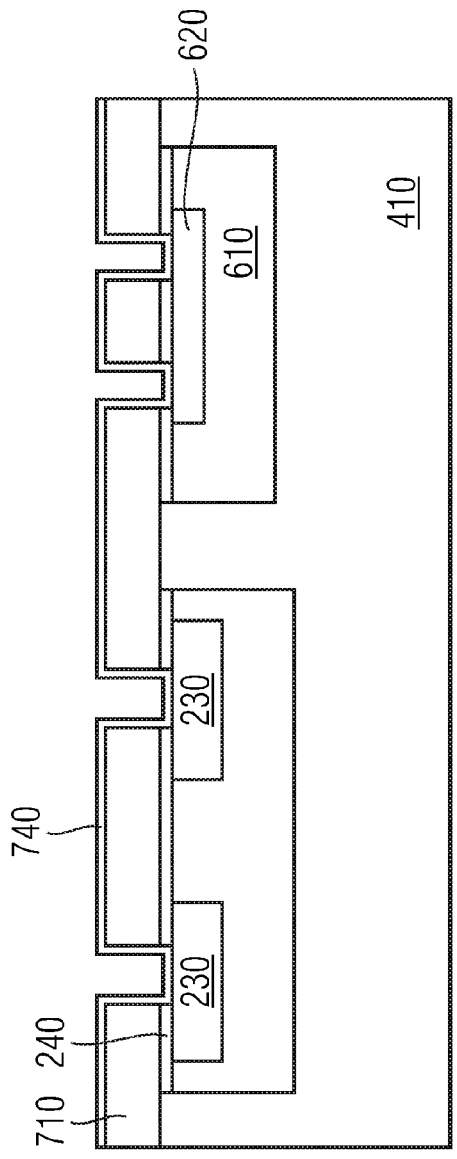
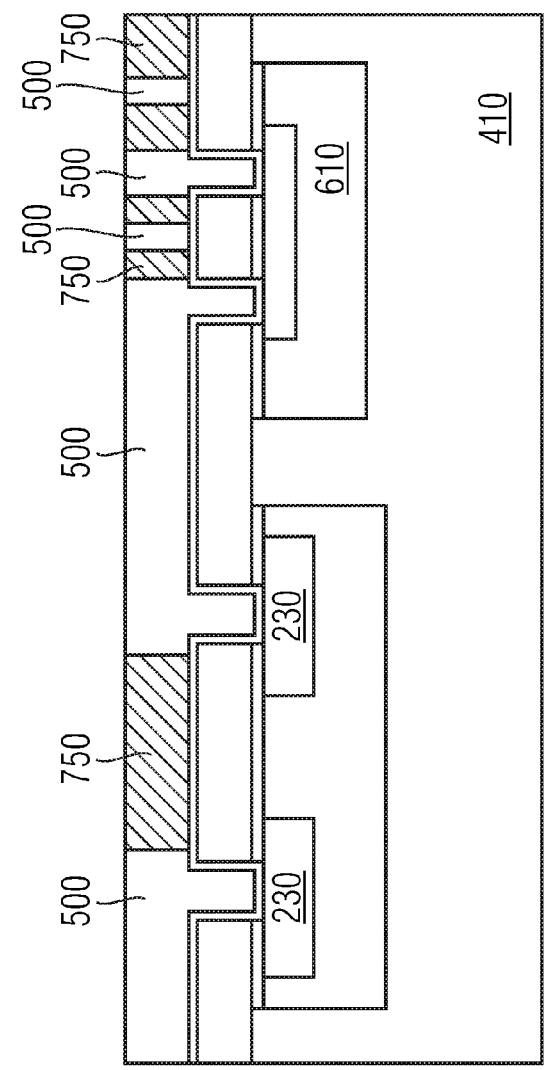

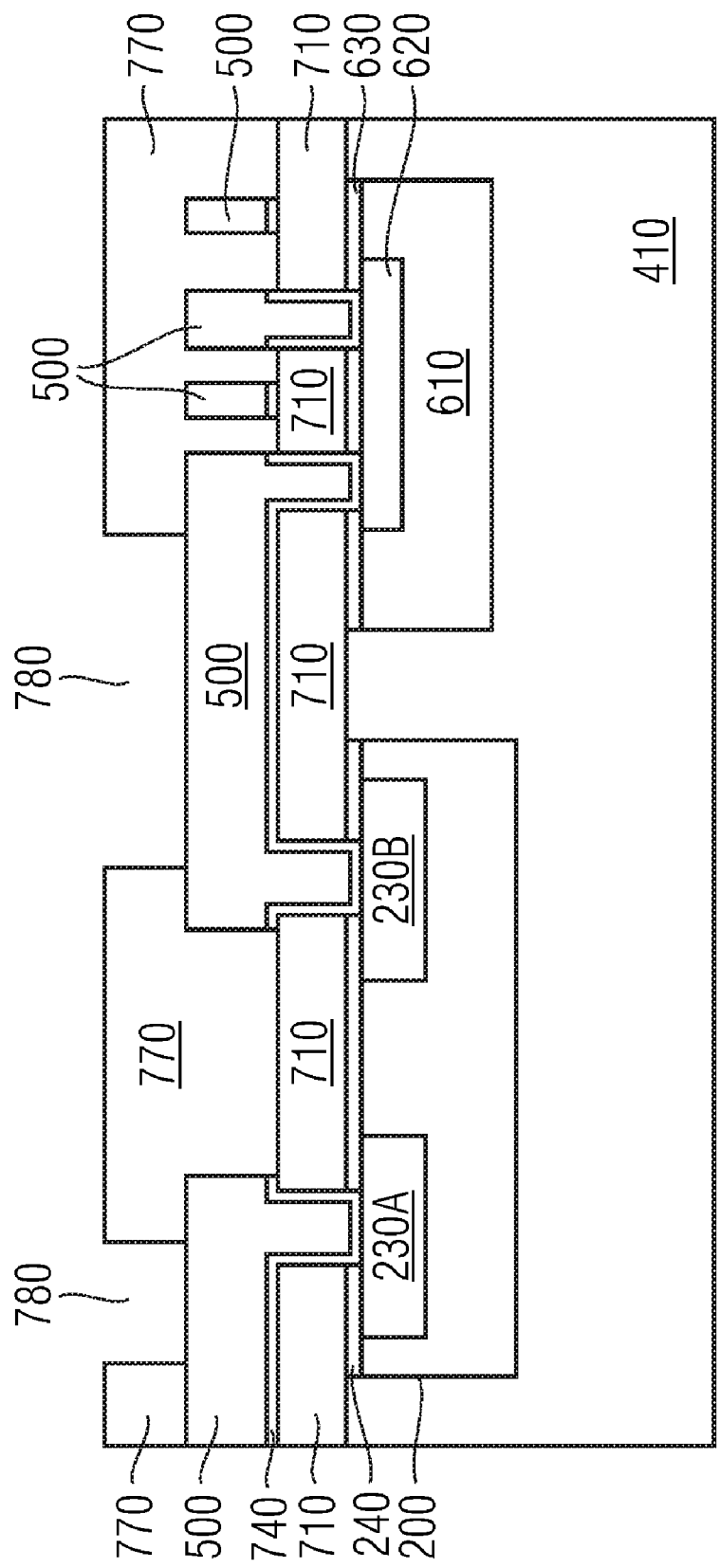

SEMICONDUCTOR DEVICE WITH CONDUCTIVE INTERCONNECT

FIELD OF THE INVENTION

Generally, the present invention relates to semiconductor devices. More particularly, the present invention relates to semiconductor devices utilizing a conductive interconnect.

BACKGROUND OF THE INVENTION

Multi-level redistribution layers may be used to realize complex wirings in the fan-out wafer level ball grid array technology (also referred to as "WLB" technology). These multi-level redistribution layers may add significantly to the cost of the wafer level packaging technology. For example, to realize a spiral inductor over the fan-out region of a WLB package it may be necessary to connect the center electrode of the inductor by a lower or upper redistribution layer with respect to the redistribution layer where the main body of the spiral coil is realized. Also, any electrically isolated crossing in the redistribution layer over the fan-out region may have to be realized by one or more levels of redistribution layers.

SUMMARY OF THE INVENTION

An embodiment of the invention is a semiconductor structure, comprising: a semiconductor chip; a conductive layer comprising at least a first conductive pathway and a second conductive pathway spacedly disposed from the first conductive pathway, the first conductive pathway electrically coupled to the chip, at least a portion of the first conductive pathway disposed outside the lateral boundary of the chip, at least a portion of the second conductive pathway disposed outside the lateral boundary of the chip; and a conductive interconnect disposed outside the lateral boundary of the chip, the conductive interconnect electrically coupling the first conductive pathway to the second conductive pathway.

An embodiment of the invention is a semiconductor structure, comprising: a support; a semiconductor chip at least partially embedded within the support; a redistribution layer electrically coupled to the chip, the redistribution layer comprising at least a first conductive pathway and a second conductive pathway spacedly disposed from the first conductive pathway; and a conductive interconnect at least partially embedded within the support outside the lateral boundary of the chip, the conductive interconnect electrically coupling the first conductive pathway to the second conductive pathway.

An embodiment of the invention is a semiconductor structure, comprising: a support; a semiconductor chip at least partially embedded within the support; a conductive region electrically coupled to the chip, the conductive region overlying the support outside the lateral boundary of the chip, the conductive region comprising at least a first portion and a second portion spacedly disposed from the first portion; and a conductive interconnect at least partially embedded within the support outside the lateral boundary of the chip, the conductive interconnect electrically coupling the first portion to the second portion.

An embodiment of the invention is a method of forming a semiconductor structure, comprising: forming a plurality of semiconductor chips on a first wafer; dicing the first wafer to form a plurality of individual chips; at least partially embedding at least two of the individual chips into a support to form a second wafer; and at least partially embedding a plurality of conductive interconnects within the support outside the lateral boundaries of the chips.

An embodiment of the invention is a method of forming a semiconductor device, comprising: at least partially embedding a semiconductor chip within a support, the support having a portion outside the lateral boundary of the chip, the chip having a final metal layer; forming a opening through a dielectric material to expose the final metal layer; forming a first metallic layer over final metal layer within the opening; and forming a second metallic layer over first metallic layer within the opening.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become clear better understood by reference to the following detailed description. The elements of the drawings are not necessarily to scale relative to each other.

FIG. 4A shows a top view of an embodiment of a semiconductor structure comprising a chip and an interconnection assembly;

FIG. 4B shows a cross sectional view of an embodiment of a semiconductor structure comprising a chip and an interconnection assembly;

FIG. 4C shows a top view of an embodiment of a semiconductor structure showing the fan-out region;

FIG. 4D shows a cross sectional view of a semiconductor structure showing the fan-out region;

FIG. 5A shows a top view of an embodiment of a semiconductor structure;

FIG. 6B shows a cross sectional view of an embodiment of a semiconductor structure;

FIG. 7B shows a cross sectional view of a an embodiment of semiconductor structure that includes an inductor;

FIGS. 9A through 9H show an example of a method of making an embodiment of a semiconductor structure.

DETAILED DESCRIPTION OF THE INVENTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

FIGS. 4A,B illustrate a semiconductor structure 100 which is an embodiment of a partially completed semiconductor device of the present invention. FIG. 4A is a top view of the structure 100 while FIG. 4B is a cross sectional view of structure 100 through AA. The structure 100 includes a semiconductor chip 200 (which may also be referred to as a die), an interconnection assembly 300 and a support structure 410. The chip 200 and the interconnection assembly 300 are supported by and embedded within the support structure 410. A cross sectional view of the semiconductor chip 200 is also shown in FIG. 1 while a cross sectional view of the interconnection assembly 300 is also shown in FIG. 2.

Figure 1:
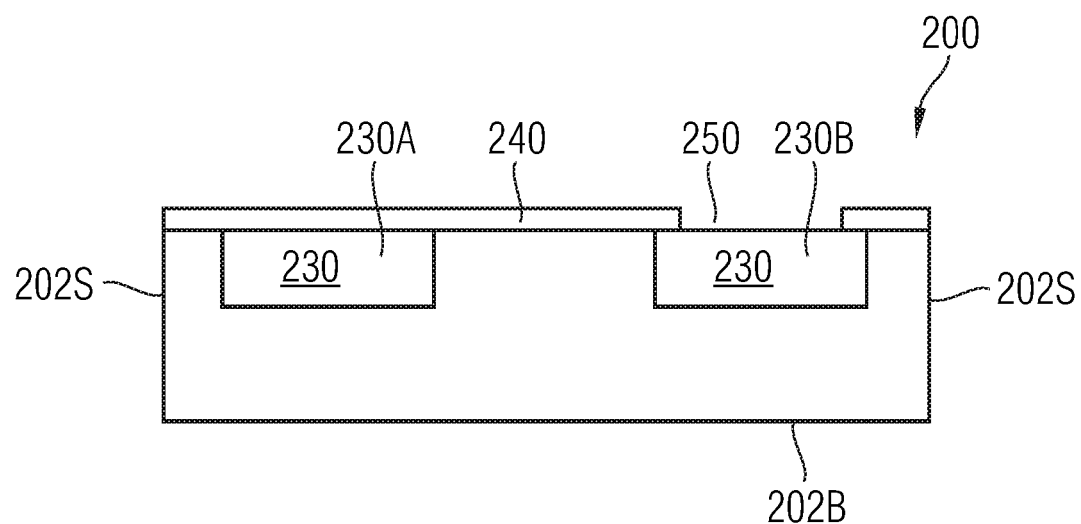
FIG. 1 shows an embodiment of a semiconductor chip.
Figure 2:
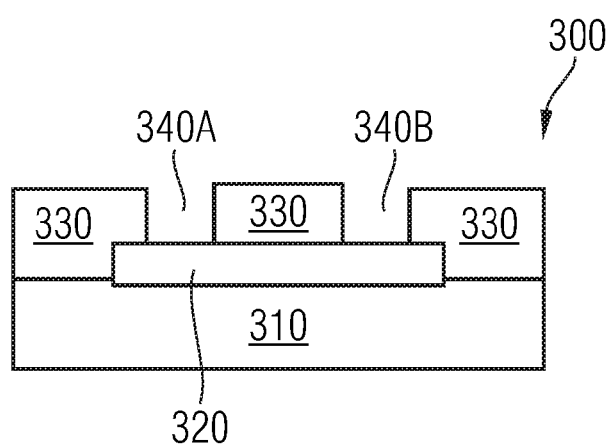
FIG. 2 shows an embodiment of an interconnection assembly.

Referring to FIG. 1, the semiconductor chip or die 200 includes a bottom surface 202B and one or more side surfaces 202S. The side surfaces 202S of the chip or die may also be referred to as the edges of the chip or die. The chip 200 includes a top or active surface which is opposite the bottom surface 202B. The chip 200 further includes a final metal layer 230 which, on one or more embodiments, may be proximate to the top or active surface of the chip. A passivation layer 240 may be formed over the final metal layer 230. It is noted that the final metal layer of the semiconductor chip may also be referred to in the art as the top metal layer.

While not shown, the chip 200 typically includes a substrate which may be adjacent or proximate to its bottom surface. Likewise, the chip may further include additional metal layers, additional dielectric layers (such as interlevel dielectric layers), components such as diodes and transistors, logic circuits, memory circuits, etc. The final metal layer may be electrically coupled to the chip substrate as well as to devices that are formed in the chip substrate.

The final metal layer 230 of the chip 200 may comprise any metallic material. The final metal layer may be any pure metal or metal alloy. The final metal layer may include one or more elements such as Cu, Al, W, Au, or Ag. In one or more embodiments, the final metal layer may include the element C. Examples of metallic materials which may be used include, but are not limited to, pure copper, copper alloy, pure aluminum, aluminum alloy, pure tungsten, tungsten alloy, pure silver, silver alloy, pure gold, and gold alloy. The final metal layer may also include barriers, liners and/or cap layers such as Ta, TaN, TaC, Ti, TiN, TiW, WN, WCN, CoWP, CoWP, NiNoP, Ru or combinations thereof.

The final metal layer may comprise one or more metal lines which may be referred to herein as final metal lines. In one or more embodiments, the final metal layer has at least two final metal lines. Each of the final metal lines of the final metal layer may be spacedly disposed from each other. Each of the final metal lines may be electrically isolated from each other. In the embodiment shown in FIGS. 4A,B, the final metal layer 230 includes at least a first final metal line 230A, a second final metal line 230B, a third final metal line 210C and a fourth final metal line 230D. In one or more embodiments, at least one of the final metal lines may include one or more bonding pads (also referred to as contact pads). In one or more embodiments, each of the final metal lines may include one or more bonding pads.

Generally, the thickness of the final metal lines is not limited to any particular thickness. In one or more embodiments, each of the final metal lines 230A-D may have a thickness which is greater than about 250 nm (nanometers). In one or more embodiments, each of the final metal lines 230A-D may have a thickness which is greater than about 400 nm. In one or more embodiments, each of the final metal lines 230A-D may have a thickness which is greater than about 500 nm. In one or more embodiments, each of the final metal lines 230A-D may have a thickness which is greater than about 600 nm. In one or more embodiments, each of the final metal lines may have a thickness which is greater than about 1000 nm. While not shown in FIGS. 1 and 4B, the final metal lines may be electrically coupled to underlying metal lines and to devices that are built within the chip substrate.

The passivation layer 240 of chip 200 may be formed of any dielectric material such as an oxide, a nitride, an oxynitride, an imide or combinations thereof. The passivation layer 240 may, for example, comprise one or more dielectric layers such as an oxide layer, a nitride layer, an oxynitride layer, an imide layer, or combinations thereof. As an example, the passivation layer may comprise an oxide layer overlying a nitride layer. As another example, the passivation layer may comprise a nitride layer overlying an oxide layer. As another example, the passivation layer may comprise a nitride-oxide-nitride stack (that is, a nitride layer overlying an oxide layer overlying another nitride layer) As another example, the passivation layer may comprise an oxide-nitride-oxide stack. In one or more embodiments, it is possible that the passivation layer 240 be formed of a high-K dielectric material. In one or more embodiments, the high-K material may have a dielectric constant greater than that of silicon dioxide. In one or more embodiments, the high-K material may have a dielectric constant greater than 3.9.

In one or more embodiments, the thickness of the oxide layer and/or the thickness of the nitride layer may be less than about 1000 nm (nanometer). In one or more embodiments, the thickness of the oxide layer and/or nitride layer may be less than about 500 nm. In one or more embodiments, the thickness of the oxide layer and/or the thickness of the nitride layer may be less than about 250 nm. In one or more embodiments, the thickness of the oxide layer and/or the thickness of the nitride layer may be less than about 200 nm. In one or more embodiments, the thickness of the oxide layer and/or the thickness of the nitride layer may be less than about 150 nm. In one or more embodiments, the thickness of the oxide layer and/or the thickness of the nitride layer may be less than about 100 nm. In one or more embodiments, the thickness of the oxide layer and/or the thickness of the nitride layer may be less than about 50 nm. In one or more embodiments, the thickness of the oxide layer and/or the thickness of the nitride layer may be less than about 25 nm. In one or more embodiments, the thickness of the oxide layer and/or the thickness of the nitride layer may be greater than about 15 nm. In one or more embodiments, the thickness of the oxide layer and/or the thickness of the nitride layer may be greater than about 30 nm.

In one or more embodiments, the thickness of the passivation layer 240 may be less than about 1000 nm. In one or more embodiments, the thickness of the passivation layer 240 may be less than about 500 nm. In one or more embodiments, the thickness of the passivation layer 240 may be less than about 250 nm. In one or more embodiments, the thickness of the passivation layer 240 may be less than about 150 nm. In one or more embodiments, the thickness of the passivation layer 240 may be less than about 100 nm. In one or more embodiments, the thickness of the passivation layer 240 may be less than about 50 nm. In one or more embodiments, the thickness of the passivation layer 240 may be less than about 25 nm.

In the embodiment of the chip 200 shown in FIGS. 4A,B, an opening 250B is formed through the passivation layer 240 so as to expose the second final metal line 230B of the final metal layer 230. The opening 250B may be in the form of a hole and may be referred to as a via opening. The opening 250B provides for future electrical coupling of the second final metal line 230B to, for example, a redistribution layer. The opening 250B may be formed by a wet etch process or a dry etch process.

Referring to FIG. 2, the interconnection assembly 300 includes a base 310. The base 310 may comprise a dielectric material. Any dielectric material may be used. The dielectric material may comprise, for example, an oxide, a nitride, an oxynitride, an imide or combinations thereof. In one or more embodiments, the base 310 may comprise an undoped silicon or a quartz material. In one or more embodiments, the base may comprise a doped silicon. In one or more embodiments, the base may comprise a polymer. In one or more embodiments, the base may comprise an epoxy. In one or more embodiments, the base may be formed of one or more of the above mentioned materials. In one or more embodiments, the base may be formed as a combination of two or more of the above mentioned materials. For example, the base may be formed of an undoped or doped silicon portion with an oxide or nitride layer on top.

The interconnection assembly 300 further includes a conductive interconnect 320. The conductive interconnect 320 may be formed on the base 310. The conductive interconnect may be formed from any conductive material. The conductive material may be metallic such as a pure metal or a metal alloy. For example, the conductive interconnect 320 may include one or more of the elements Cu, Al, W, Au, or Ag. The conductive interconnect may be formed of pure copper, copper alloy, pure aluminum, aluminum alloy, pure tungsten, tungsten alloy, pure silver, silver alloy, pure gold or gold alloy. The conductive material may be non-metallic. For example, the conductive material may be a doped polysilicon. The conductive material may be a conductive polymer.

In one or more embodiments, there may be two or more conductive interconnects formed on the base 310. If there is more that one conductive interconnect formed on the base 310, then each of the conductive interconnects may be spacedly disposed for each other. In addition, each of the conductive interconnects may be spacedly disposed and electrically isolated from each other. Each conductive interconnect may be formed, for example, by one or more of the techniques such as sputtering, plating, evaporation, CVD, atomic layer deposition followed by patterning (which may be lithography plus etching) steps or alternatively patterned plating or any damascene technology.

The interconnection assembly 300 may further include a dielectric material 330 disposed over the conductive interconnect 320. The dielectric material 330 may be any dielectric material. For example, the dielectric material 330 may be an oxide (such as silicon oxide), a nitride (such as silicon nitride), an imide, a polyimide, a photoimide, a BCB (Benzo-cyclo-butene), etc.

A first opening 340A and a second opening 340B are formed in the dielectric material 330 so as to expose two spacedly disposed portions of the conductive interconnect 320. In one or more embodiments, each of the openings 340A,B may be in the form of a hole. The openings 340A,B may be referred to as via openings. The openings 340A,B provide for the possibility of electrically coupling a conductive redistribution layer to the conductive interconnect 320. In one or more embodiments, the via openings 340A,B may have a diameter which is greater than about 0.5 μm (microns) or 500 nm (nanometers).

In the embodiment shown in FIGS. 4A,B, the chip 200, the interconnection assembly 300 as well as the conductive interconnect 320 are all embedded within a support 410 (also referred to as a support structure or a support substrate). The conductive interconnect 320 is also embedded within the support 410. In the embodiment shown in FIG. 4B, the top surface of the conductive interconnect 320 is below the top surface of the support 410.

In the embodiment shown in FIG. 4B, the chip 200 and the interconnect assembly 300 are embedded within the support 410 such that the support contacts the bottom and side surfaces of the chip 200 and the interconnection assembly 300 but the support does not contact the top surfaces of either the chip or the interconnection assembly. In other embodiments of the invention, the chip 200 and/or the interconnection assembly 300 may be embedded within the support such that the support may also be formed over at least a portion of the top surface of the chip 200 and/or at least a portion of the top surface of the interconnection assembly 300. Likewise, in other embodiments, the chip and the interconnection assembly may be embedded within the support such that the support contacts the sides of the chip and/or the sides of the interconnection assembly but not the top or bottom surfaces of the chip and/or the interconnection assembly.

In one or more embodiments, the chip and/or the interconnection assembly and/or the conductive interconnect may be at least partially embedded within the support. In one or more embodiments, the chip and/or the interconnection assembly and/or the conductive interconnect may be partially embedded within the support. In one or more embodiments, the chip and/or the interconnection assembly and/or conductive interconnect may be totally embedded within the support.

In one or more embodiments, it is also possible that a conductive interconnect 320 be at least partially embedded within support 410 without the remaining portions of the interconnection assembly 300. For example, the conductive interconnect may be a conductive plate (such as a metal plate) that is at least partially embedded within the substrate 410. In an embodiment, the top surface of the conductive plate may be disposed below and covered by the support 410. In this embodiment, openings, such as openings 340A,B may be made through the support 410 to expose two portions of the conductive plate. In another embodiment, the substrate 410 may cover the bottom and side surfaces of the plate but leave the top of the plate exposed (in this case, an additional dielectric may be formed over the plate, and openings may be formed in this additional dielectric).

In the embodiment shown in FIGS. 4A and 4B, the interconnection assembly 300 (as well as the corresponding conductive interconnect 320) is laterally spacedly disposed or spacedly displaced from the chip 200 such that there is some lateral distance or space between the interconnection assembly 300 and the chip 200. However, in another embodiment, it is possible that the interconnect assembly 300 be simply laterally disposed from the chip 200 which would thus include the possibility that the interconnect assembly touches or abuts up again the chip 200. Likewise, in another embodiment, it is possible that the conductive interconnect 320 be embedded within a support 410 so that it touches or abuts up against the chip 200.

FIG. 1 shows a single semiconductor chip 200, however, a plurality of semiconductor chips 200 may be formed at the same time on a single semiconductor wafer. The semiconductor wafer may then be singulated or diced into individual semiconductor chips 200. Singulation or dicing may be done with, for example, using a diamond saw or a laser (or by any other method such as a chemical method). Likewise, a plurality of interconnection assemblies 300 may also be formed on a different single wafer. This wafer too may then be singulated or diced into individual interconnection assemblies 300.

After forming a plurality of individual semiconductor chips (such as shown in FIG. 1) and a plurality of individual interconnection assemblies (such as shown in FIG. 2), the individual chips 200 as well as the individual interconnection assemblies 300 may be assembled together to form a reconfigured wafer. The reconfigured wafer may be formed by first doing a pre-assembly of at least one semiconductor chip 200 (such as shown in FIG. 1) and at least one of the interconnection assembly 300 (such as shown in FIG. 2) together onto a carrier. In one or more embodiments, the pre-assembly process places a plurality of the individual semiconductor chips 200 in a regular fashion with a certain distance to each other. In one or more embodiments, this distance may be about 1 μm (micrometer or micron) to about several millimeter to each other. In one or more embodiments, the distance between the chips on the reconfiguration wafer may be greater than the distance on the original wafer.

The pre-assembly process may be done by placing the chips onto the surface of a carrier using a double sided adhesive tape. Next, one or more of the interconnection assemblies 300 may be positioned with their top surfaces (e.g., the surface having openings 340A,B) facing down on the carrier in the neighborhood of each of the chips also with the use of the tape. In one or more embodiments, one or more of the interconnection assemblies 300 may be placed adjacent to or proximate to a corresponding semiconductor chip 200. In one or more embodiments, the interconnection assemblies are spacedly disposed from the chips. In one or more embodiments, it is possible that the interconnection assemblies may touch the chips.

The exact placement of the interconnection assembly 300 relative to a corresponding chip 200 may be at least partially determined by the desired location of one or more electrically conductive interconnects which will serve as connective links between different portions of a redistribution layer. As noted, in one or more embodiment, the interconnection assemblies may be spacedly disposed from the corresponding chip. In one or more embodiments, the interconnection assemblies may be touching the corresponding chip.

Hence, in one or more embodiments of the invention, the chips and the interconnect assemblies may be placed face down onto the tape. For example, the opening 250 of the chip 200 as well as the openings 340A,B of the interconnection assembly face toward the tape. The chip bottom and assembly bottoms point away from the tape.

After placing the semiconductor chips 200 and the corresponding interconnection assemblies 300 onto a tape, the chips and assemblies are at least partially embedded within a support structure. This may be done is various ways. For example, the tape, the chips and the interconnect assemblies may be placed within a molding chamber, which is then filled with a liquid molding compound. In one or more embodiments, the molding compound may comprise a dielectric material. In one or more embodiments, the molding compound may comprise a dielectric material. In one or more embodiments, the molding compound may consist essentially of a dielectric material. In one or more embodiments, the molding compound may comprise one or more of a variety of materials such as a plastic, polyimide, an epoxy based material or a BCB (Benzo-cyclo-butene). In one or more embodiments, the molding compound may have a low coefficient of thermal expansion (CTE) or a CTE that matches that of the silicon semiconductor chip. The molding compound fills in the spaces between the chips and the assemblies and may additionally be poured to a level which is above the bottom sides of the chips and interconnection assemblies.

After a molding compound has been used, an application of heat and/or pressure may then be used to harden the resin and build a planar assembly of a molded wafer with the embedded chips and interconnect assemblies. The molded wafer may then be removed from the carrier plate and the tape may be peeled away from the molded reconfigured wafer. The molding compound forms the support structure (also referred to as the support substrate or the support) for the reconfigured wafer.

In one or more embodiments, the molding compound may contact the side surfaces and the bottom surfaces of the chips and the interconnection assemblies without contacting the tops surfaces. After the tape is removed, the top surfaces of the semiconductor chips and the interconnection assemblies are revealed to be exposed through the top surface of the support substrate.

It is noted that in another embodiment it is possible that the molding compound is only formed about the side surfaces of the chip and or interconnection assembly without contacting either the top or bottom surfaces. Also, in another embodiment it is possible that the molding compound is formed over at least a portion of the top surfaces of the chip and/or the interconnection assembly.

Figure 3A:
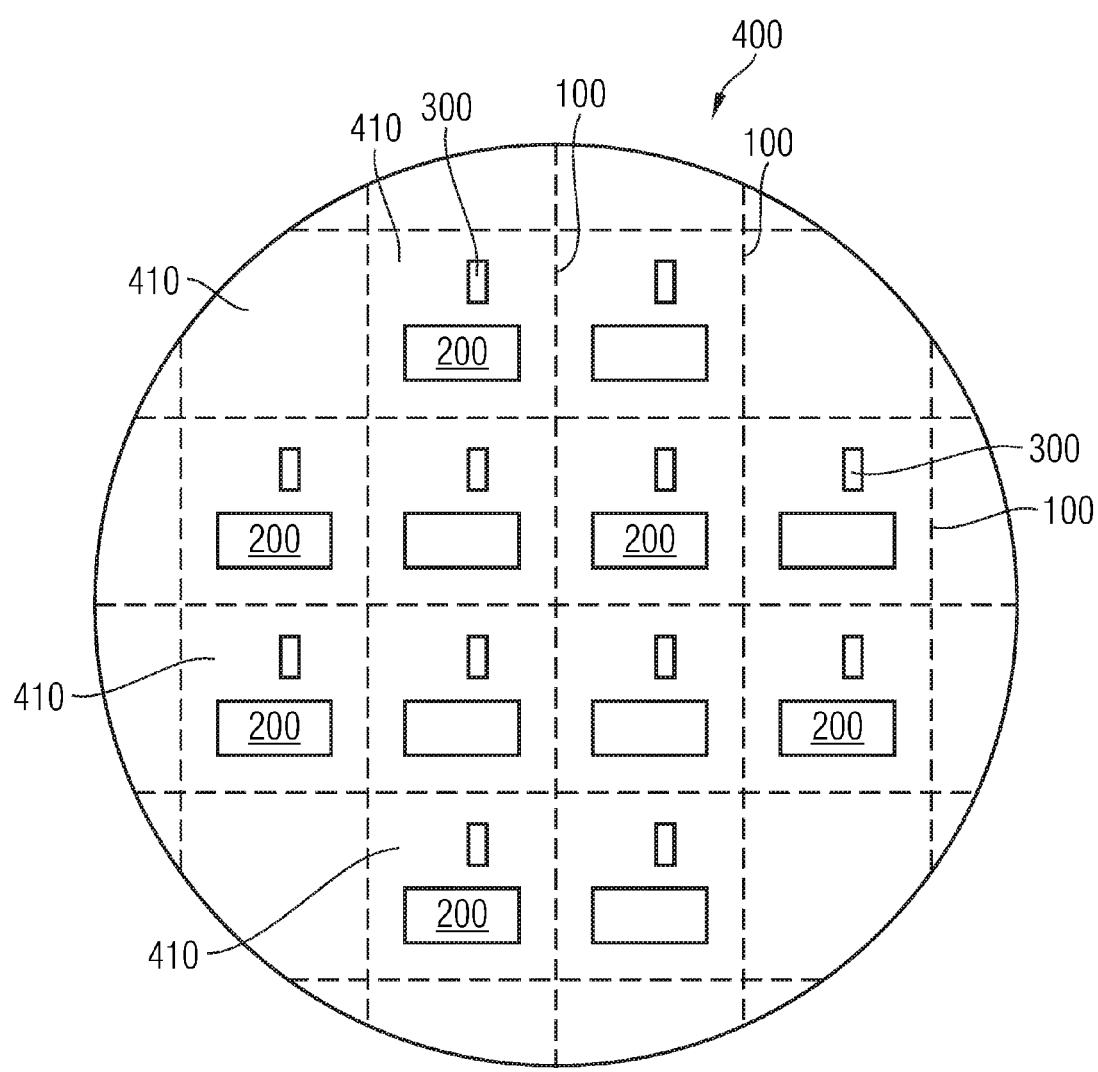
FIG. 3A shows a top view of an embodiment of a reconfiguration wafer.

FIG. 3A shows a top view of an embodiment of a reconfigured wafer 400 that includes chips 200 and interconnection assemblies 300 embedded and supported within a support substrate 410. The wafer 400 includes a plurality of structures 100. Each structure 100 represents an embodiment of an individual partially completed semiconductor device. Each of the structures 100 includes a semiconductor chip 200 and an interconnection assembly 300. In the embodiment shown in FIG. 3A, the average distance between the chips 200 in the reconfigured wafer 400 is larger than the average distance between the chips in the original wafer.

Referring to FIG. 3A, it is seen that the lateral dimensions of the reconfigured wafer 400 extend beyond the lateral dimensions of the chips 200. The portion of the wafer 400 that is laterally outside the lateral boundaries of the chips 200 is referred to as the fan-out region of the reconfigured wafer 400.

Figure 3B:
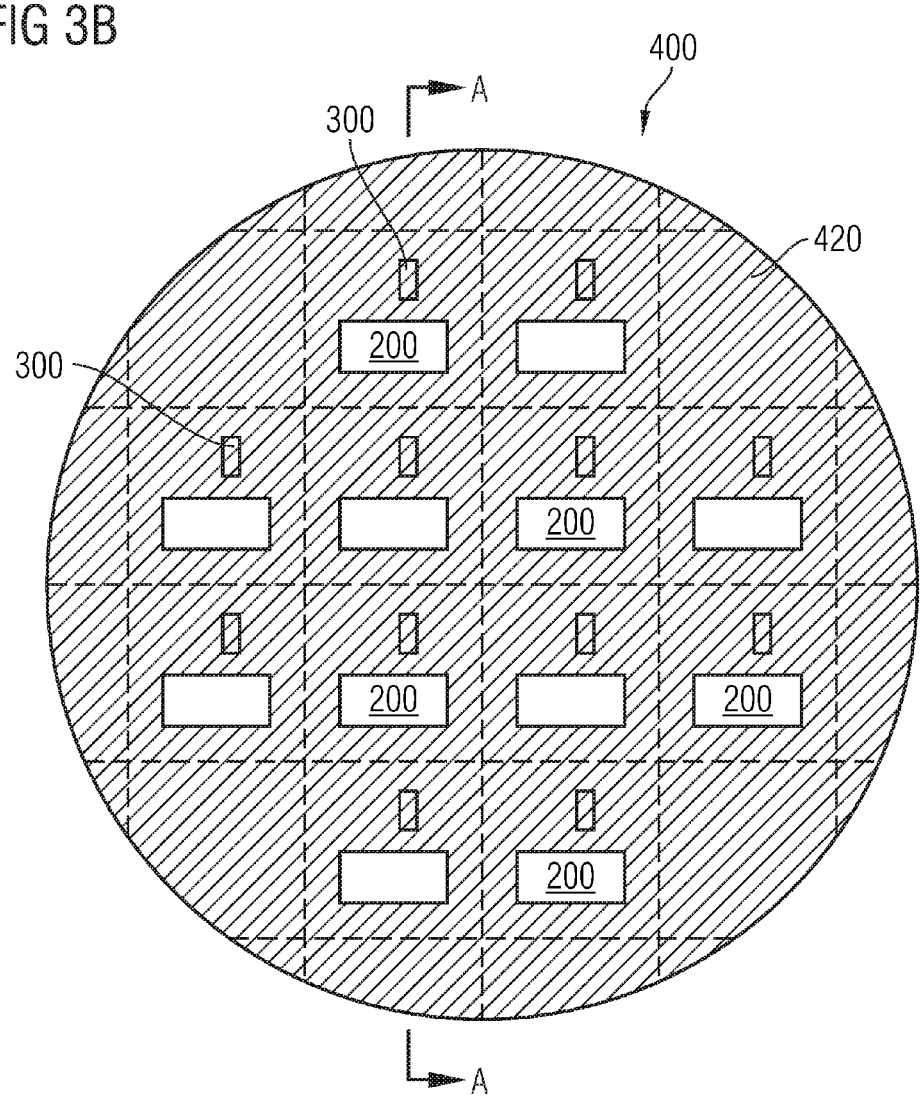
FIG. 3B shows a top view of an embodiment of a reconfiguration wafer showing the fan-out region.
Figure 3C:
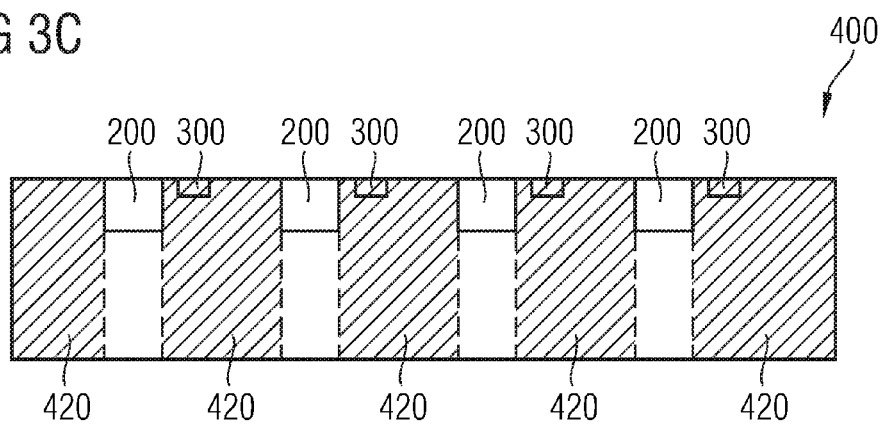
FIG. 3C shows a cross sectional view of an embodiment of a reconfiguration wafer showing the fan-out region.

FIG. 3B shows a top view of the fan-out region 420 of the reconfigured wafer 400. The fan-out region 420 is shown as the hatched area. The fan-out region of the wafer extends to the edge of the wafer. FIG. 3C shows a cross sectional view of the wafer 400 through AA. FIG. 3C shows a cross sectional view of the fan-out region of the wafer 400. From FIGS. 3B and 3C, it is seen that the interconnection assemblies 300 (as well as the corresponding conductive interconnects 320), being laterally spacedly disposed from the chips 200 are disposed within the fan-out region of the wafer 400.

FIGS. 4A,B show top and cross sectional views of a structure 100 that includes a semiconductor chip 200 and an interconnection assembly 300 embedded or disposed within a support structure 410. FIG. 4B shows a cross sectional view of FIG. 4A through AA. It is understood that the structure 100 shown in FIGS. 4A,B represents a portion of the reconfigured wafer 400 and that it represents one of a plurality of substantially identical structures 100 which are part of the reconfigured wafer 400 shown in FIG. 3A.

Referring to FIGS. 4A and 4B it is seen that the lateral boundaries of the structure 100 extend beyond the lateral boundaries of the chip 200. The portion of structure 100 that is laterally outside the lateral boundaries of the chip 200 is the fan-out region of the structure 100. FIG. 4C shows a top view of the fan-out region 420 of the structure 100. FIG. 4D shows a cross sectional view of the fan-out region 420 of the structure 100 through AA. The fan-out region 420 is shown as the hatched region. It is noted that the fan-out region of the structure, while laterally outside the lateral boundary of the chip, may extend below the bottom of the chip or above the top surface of the chip.

From FIGS. 4C and 4D, it is seen that the interconnection assembly as well as the corresponding conductive interconnect 320, are disposed outside the lateral boundary of the chip. Both are embedded within the support 410 and both lie within the fan-out region of structure 100.

In the embodiment shown in FIG. 4C and 4D, the interconnection assembly 300 (as well as the corresponding conductive interconnect) is laterally spacedly disposed from the lateral boundary of the chip 200. In this case, there is some positive distance or space between the interconnection assembly 300 and the lateral boundary of the chip 200. It is also possible, in another embodiment, that the interconnection assembly 300 (or even just the conductive interconnect 320 without the remaining pieces of the interconnection assembly) touch a side of the chip 200. Hence, more generally, the interconnection assembly 300 (or just the conductive interconnect 320) may be laterally disposed from the chip 200 which includes the embodiment "laterally spacedly disposed" where there is some space between the assembly 300 (or just the interconnect 320) and the chip 200 as well as the embodiment where there is no space between the assembly 300 (or just the interconnect 320) and the chip 200 (for example, where the chip touches the interconnection assembly or just the interconnect).

After the reconfigured wafer is formed (such as by a molding process), an optional dielectric (for example, an oxide, a nitride, an oxynitride, a polyimide, a BCB, etc) may be deposited over the structure 100 shown in FIGS. 4A,B. Hence, an optional dielectric may be formed over the semiconductor chip 200, the interconnection assembly 300 and the support 410. In this optional dielectric, openings may be formed that expose one or more spacedly disposed surfaces of the final metal layer 230 of chip 200 as well as to expose one or more spacedly disposed surfaces of the conductive interconnect 320. These exposed surfaces may be contact pad regions of the final metal layer as well as contact pad regions of the conductive interconnect. The optional dielectric is not shown in FIGS. 4A-D.

Figure 5B:
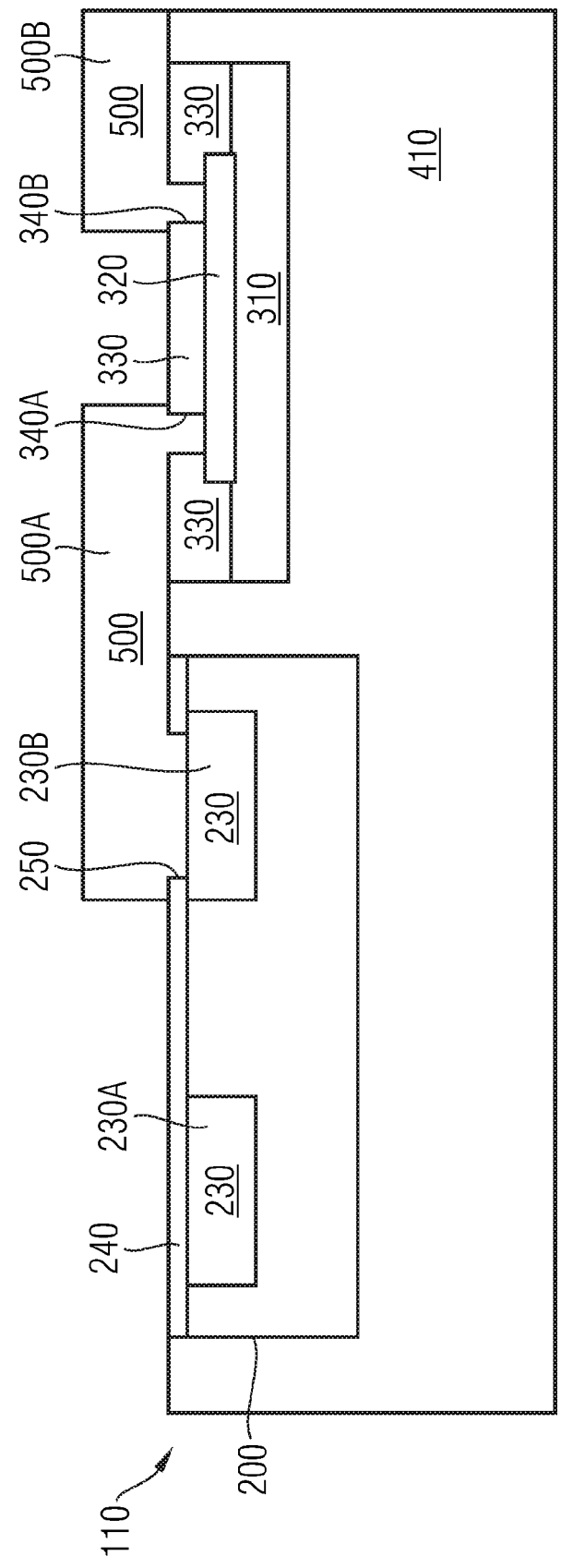
FIG. 5B shows a cross sectional view of an embodiment of a semiconductor structure.

Referring to FIGS. 5A,B, (with FIG. 5A being a top view and FIG. 5B being a corresponding cross sectional view through AA), a redistribution layer 500 is formed over the structure 100 from FIGS. 4A,B to form the structure 110 in FIGS. 5A,B. The redistribution layer 500 comprises a first conductive pathway 500A and a second conductive pathway 500B.

More generally, a redistribution layer may include one or more conductive pathways. In one or more embodiments, each of the conductive pathways may be a conductive trace. In one or more embodiments, the redistribution layer may comprise two or more conductive pathways which are spacedly disposed from each other. In one or more embodiments, the redistribution layer may comprise two or more conductive pathways which are electrically isolated from each other.

Hence, in one embodiment, the redistribution layer may be a single continuous conductive layer. However, the redistribution layer need not be a single continuous conductive layer. Instead, it may comprise a plurality of spacedly disposed conductive portions. Each conductive portion may form a conductive pathway. Each of the conductive pathways may have any shape. For example, they may be straight or curved. They may be star shaped (for example, fingers radiating from a central location). The one or more conductive pathways of the redistribution layer may be formed as conductive lines.

Generally, the redistribution layer may be formed of any conductive material. In one or more embodiments, the redistribution layer may comprise a metallic material. The metallic material may be a pure metal or a metal alloy. The metallic material may include one or more of the elements Cu, Al, W, Ag or Au. In one or more embodiments, the metallic material may comprise the element C (carbon). In one or more embodiments, the redistribution layer may be formed of a non-metallic material such as a doped polysilicon or a conductive polymer. In one or more embodiments, the redistribution layer may, for example, be at least 1 μm (micron) thick and/or at least 1 μm (micron) wide. In one or more embodiments, the redistribution layer may, for example, be at least 2 microns thick and/or at least 2 microns wide.

The redistribution layer may, for example, be useful in distributing electrical signals or electrical energy to various portions of the semiconductor wafer, structure or device. The electrical signals may be in the form of electrical current or voltage. In one or more embodiments, the redistribution layer may redistribute electrical signals to other positions that overlie the semiconductor chip. In one or more embodiments, the redistribution layer may redistribute electrical signals to positions that extend beyond the lateral boundaries of the chip. Hence, the redistribution layer may redistribute electrical signals to the fan-out region of the wafer, structure or device. Hence, in one or more embodiments, at least a portion of the redistribution layer may extend into the fan-out region of the wafer, structure or device.

In one or more embodiments of the invention, conductive balls (such as metallic balls or solder balls) may be electrically coupled to the conductive pathways (such as to ends or termination points of the conductive pathways). The conductive balls may be used to electrically couple the structure to, for example, a printed circuit board. In one or more embodiments, the resulting wafer, structures or semiconductor devices may be formed as a wafer level ball package.

Referring again to FIGS. 5A and 5B, the redistribution layer 500 includes a first conductive pathway 500A and a second conductive pathway 500B. First conductive pathway 500A and second conductive pathway 500B are spacedly disposed from each other. One end of the first conductive pathway 500A is electrically coupled to the final metal line 230B through the opening 250B. The opposite end of first conductive pathway 500A is electrically coupled to the conductive interconnect 320 through the opening 340A. One end of second conductive pathway 500B is electrically coupled to the conductive interconnect through the opening 340B. Hence, the conductive interconnect 320 electrically couples the first conductive pathway 500A to the second conductive pathway 500B.

Figure 5C:
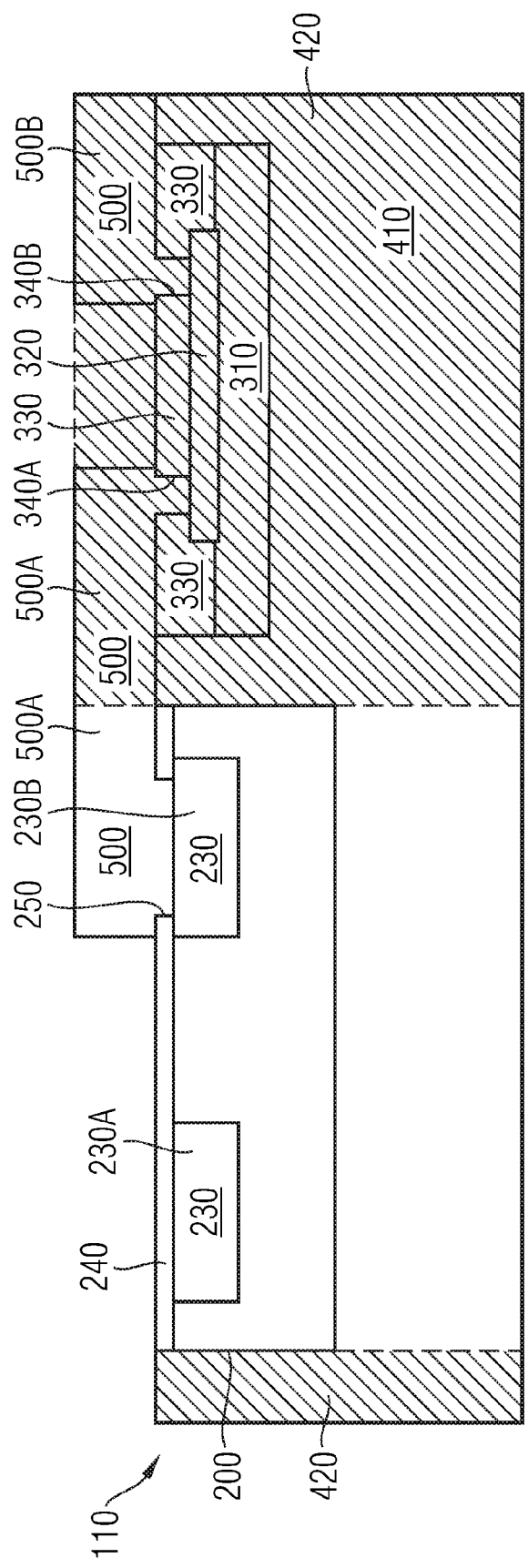
FIG. 5C shows a cross sectional view of an embodiment of a semiconductor structure.

FIG. 5C shows the same cross sectional view from FIG. 5B but also shows fan-out region 420 of the structure 110. The fan-out region 420 is shown as the hatched area. This corresponds to the portion of the structure 110 that is laterally outside the lateral boundary of the chip 200. FIG. 5C shows that a portion of the first conductive pathway 500A is in the fan-out region of the structure 110 (while a portion is not). FIG. 5C also shows that the entire second conductive pathway 500B is in the fan-out region of the structure 110.

Figure 6A:
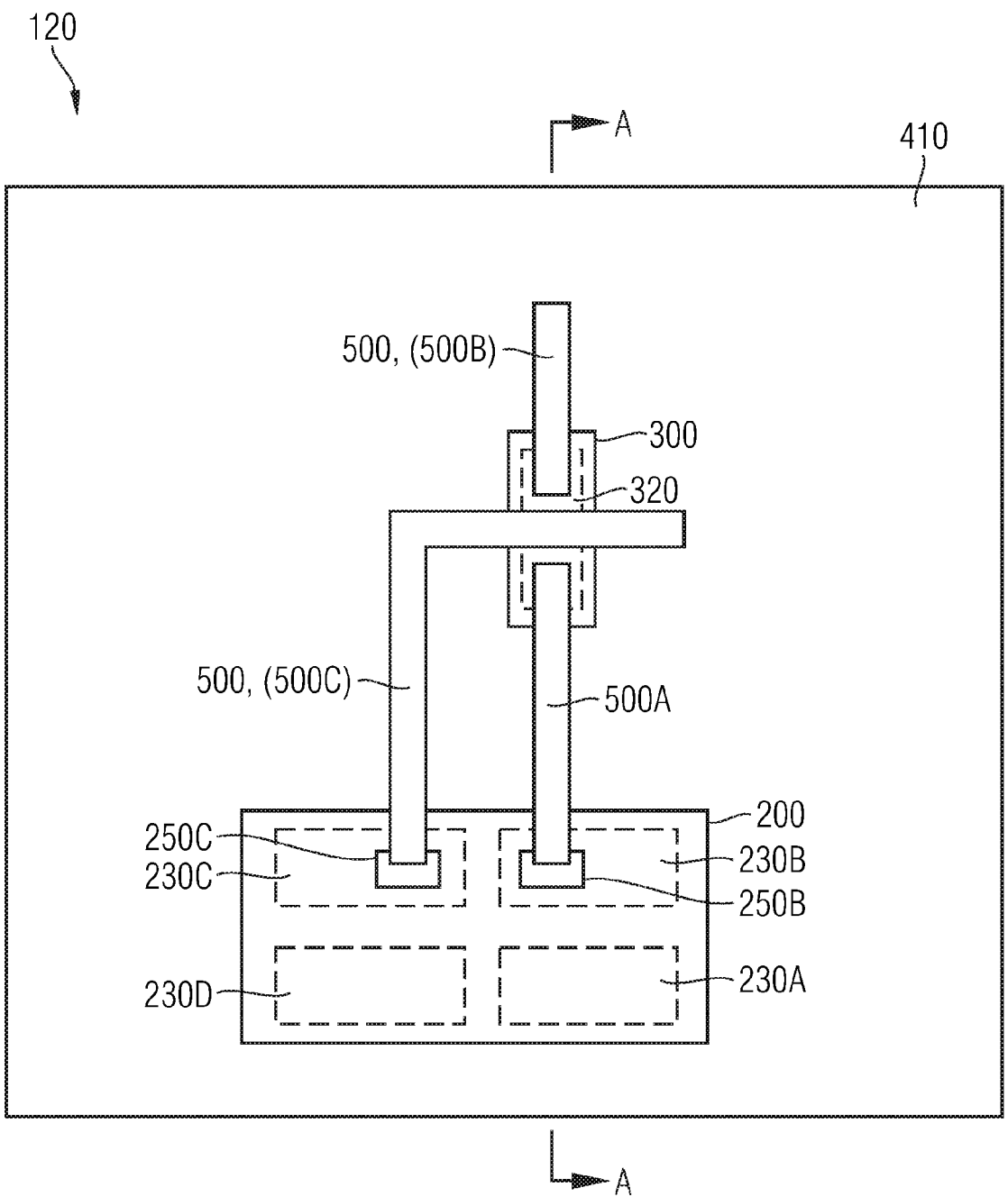
FIG. 6A shows a top view of an embodiment of a semiconductor structure.

FIGS. 6A and 6B (where FIG. 6B is a cross sectional view of FIG. 6A through the cross section AA) show a structure 120. Structure 120 is the same as structure 110 except that a third conductive pathway 500C has been added to the redistribution layer 500. Third conductive pathway 500C has a first end which is electrically coupled to the final metal line 230C through an opening 250C in the passivation layer. While a portion of third conductive pathway 500C overlies the chip 200, a portion of third conductive pathway 500C also lies outside the lateral boundary of chip 200 and is in the fan-out region of the structure 120. In addition, it is seen that the third conductive pathway 500C also crosses over the conductive interconnect 320. Hence, the conductive interconnect 320 behaves as a conductive underpath between first conductive pathway 500A and second conductive pathway 500B. It electrically couples a first conductive pathway 500A of the redistribution layer to a second conductive pathway 500B of the redistribution layer while allowing a third conductive pathway 500C of the redistribution layer to cross over it and remain electrically isolated from the first conductive pathway and second conductive pathway.

Once again, it is noted that conductive balls (for example, solder balls or some other type of metallic balls) may be coupled, for example, to the end of the second conductive pathway 500B which is not coupled to the interconnect 320. In another embodiment, a conductive ball may be coupled to the end of the third conductive pathway that is not coupled to the final metal line 230C. The conductive balls may be used to electrically couple the structure or device to, for example, a printed circuit board. However, it is noted that the conductive interconnect 320 may be used whether or not conductive balls are added to the design.

Figure 7A:
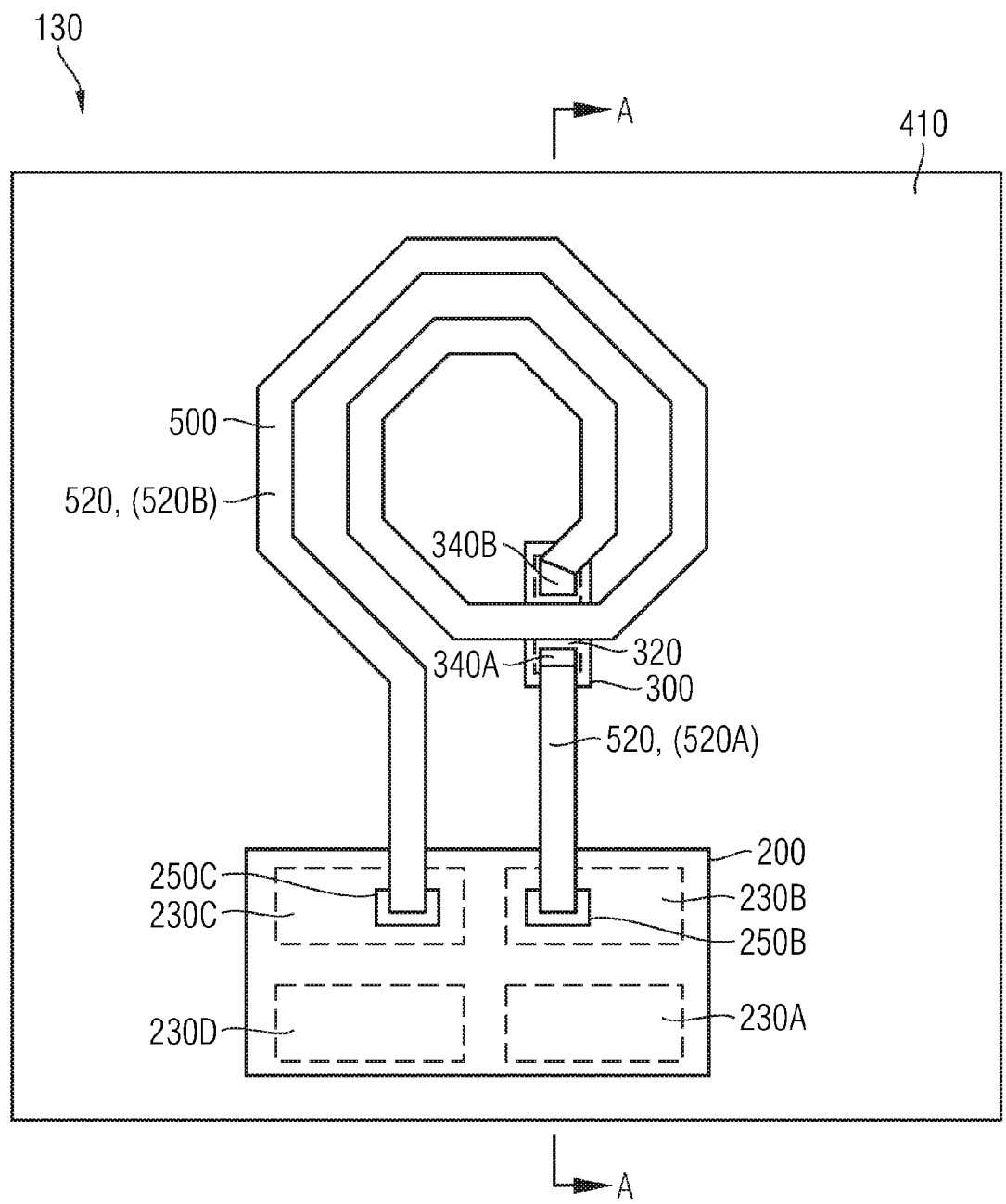
FIG. 7A shows a top view of an embodiment of a semiconductor structure that includes an inductor.

In one or more embodiments, at least part of the redistribution layer may also be disposed so as to form an inductor. FIG. 7A shows a top view of a structure 130. The structure 130 includes a semiconductor chip 200 and a conductive interconnect 320, each embedded within a support 410. The structure 130 also includes a redistribution layer 500. In this embodiment, at least a portion of the redistribution layer 500 is shaped to form a coil 520. Coil 520 forms an inductive element or inductor. The inductor may be referred to as a spiral inductor. FIG. 7B shows a cross sectional view of the structure 130 shown in FIG. 7A through AA.

In the embodiment shown in FIGS. 7A and 7B, essentially all of the inductor coil 520 lies outside the lateral boundary of chip 200 and is disposed in the fan-out region of the structure 130. However, in other embodiments, it is possible that only a portion of the inductor coil 520 may be in the fan-out region of the structure 130. It is noted that the redistribution layer may be shaped to form any spiral shaped coil such as, for example, octagon spiral, square spiral or circular spiral. A spiral inductor (such as the one shown in FIGS. 7A,B) may have a higher inductance compared to a single loop inductor.

The inductor 520 includes a first conductive pathway 520A and a second conductive pathway 520B. In order to form the spiral shape to the inductor coil 520 shown in FIGS. 7A,B, the conductive interconnect 320 may be used to electrically couple the first conductive pathway 520A of the inductor coil 520 to the second conductive pathway 520B of the inductor coil 520. In this embodiment, the conductive interconnect 320 also acts as an underpass such that a portion of the second conductive pathway 520B of the inductor coil 520 actually crosses above and is spacedly disposed from the conductive interconnect 320.

Once again, in the top view shown in FIG. 7A, it is seen that the inductor 520 includes two portions, a first conductive pathway 520A and a second conductive pathway 520B. One end of the first conductive pathway 520A is electrically coupled to the second final metal line 230B (through opening 250B). The other end of the first conductive pathway 520A is electrically coupled to the conductive interconnect 320 through opening 340A. Likewise, one end of the second conductive pathway 520B is electrically coupled to the third final metal line 230C (through an opening 250C). The other end of the second conductive pathway 520B is electrically coupled to the conductive interconnect 320 through the opening 340B.

It is seen that that first conductive pathway 520A and the second conductive pathway 520B of the inductor 520 are two spacedly disposed portions of the redistribution layer 500. The conductive interconnect 320 electrically couples the first conductive pathway 520A to the second conductive pathway 520B. The conductive interconnect 320 also serves as a conductive underpath for the inductor 520 allowing a portion of the inductor 520 (e.g., a portion of the second conductive pathway 520B) to actually cross over the conductive interconnect 320. It is seen that the conductive interconnect is disposed below the redistribution layer. This allows the redistribution layer to loop around and cross over the conductive interconnect.

Creating a spiral shape to the inductor coil may increase the inductance of the inductor (e.g., the spiral inductor may have a higher inductance than a loop inductor). In addition, placing at least a portion of the inductor coil within the fan-out region of the structure 130 or placing essentially all of the inductor coil within the fan-out region of the structure may also increase the quality or Q-factor of the inductor because the portion in the fan-out region is not overlying (or underlying) the chip and is further away from the chip substrate (for example, there may be no Eddy currents and no capacitive coupling to the chip substrate with lower parasitic losses).

It is noted that in one or more embodiments of the invention, the redistribution layer may be used solely for forming one or more inductors. Likewise, in one or more embodiments, it is possible that only part of the redistribution layer be used to form one or more inductors while a remaining part of the redistribution layer be used to distribute electrical signals (such as voltages and currents) to, optionally, conductive balls. One or more of the conductive balls may overlie the chip while one or more of the conductive balls may be in the fan-out region of the structure and thus not overlie the chip. Likewise, in one or more embodiments, it is possible that the entire redistribution layer is used for redistributing electrical signals.

It is noted that an interconnection assembly may be made in many different ways. In the embodiment shown in FIG. 2, the interconnect assembly 300 may be made by first forming the base 310 and then forming the conductive interconnect 320 over the base 310. The conductive interconnect 320 may be formed by depositing a conductive layer over the base 310 and then used lithographic and etch techniques to form a conductive interconnect having a desired shape. A dielectric layer 330 may then formed over the conductive layer 320. Openings may then formed in the dielectric layer 330 to expose the top surface of the conductive interconnect 320 and one or more locations (preferably spacedly disposed locations). It is noted that the dielectric layer 320 may be made with varying thicknesses. For example, in one or more embodiments, the dielectric layer 330 may be made to have a thickness which is about the same as the passivation layer which is formed over the semiconductor chip.

Figure 8A:
FIGS. 8A through 8E show an example of a making an embodiment of an interconnection assembly.
Figure 8B:
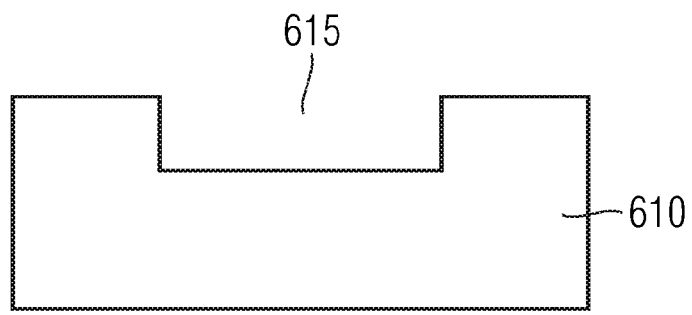
Figure 8C:
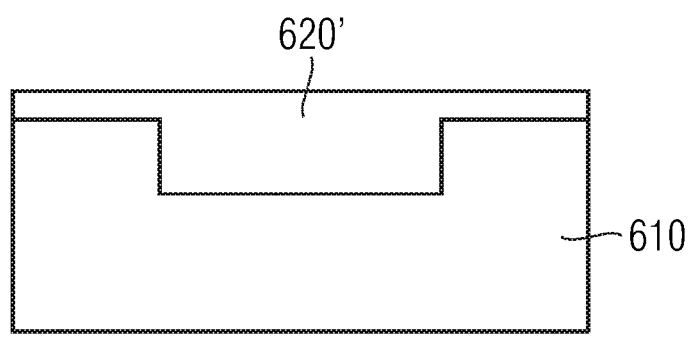
Figure 8D:
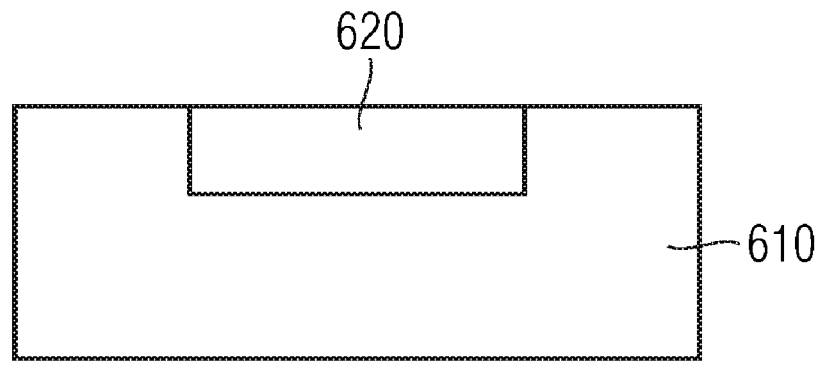
Figure 8E:
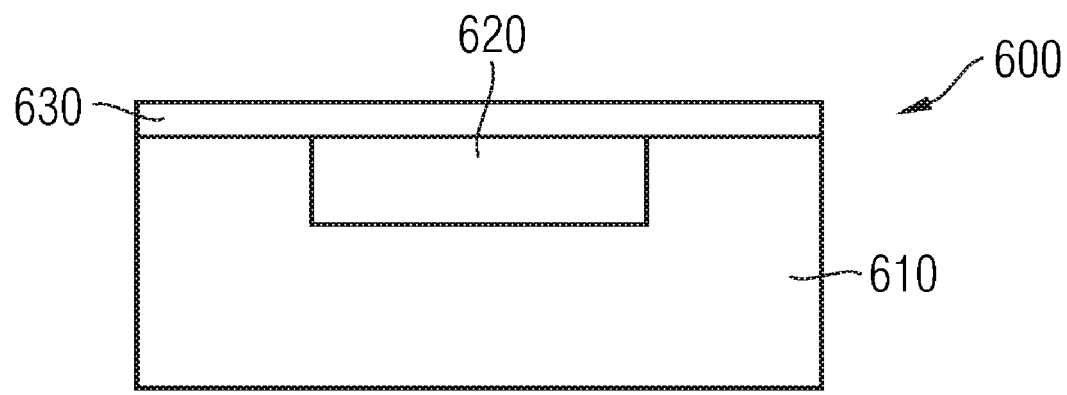

Another embodiment of an interconnection assembly is shown in FIG. 8E. FIG. 8E shows an interconnect assembly 600 which comprises a base layer 610, a conductive interconnect 620 and an upper dielectric layer 630. FIGS. 8A-E show the formation of interconnection assembly 600 of FIG. 8E. Referring to FIG. 8A, the interconnection assembly 600 may be formed by first forming the base layer 610. Then a recess 615 is formed in the base layer 610 as shown in FIG. 8B. A conductive material 620' is then deposited into the recess 615 and over the base layer 610 as shown in FIG. 8C. The conductive material 620' is then mechanically polished to form the conductive interconnect 620 as shown in FIG. 8D. A dielectric layer 630 is then formed over the conductive interconnect 620. The dielectric layer 630 shown in FIG. 8E may be thinner than the upper dielectric layer 330 shown in FIG. 2. In fact, the dielectric layer 630 may have a thickness similar to that of the passivation layer 240 disposed over the final metal layer 230 of the chip 200 shown in FIGS. 4A,B. It is noted that the materials used to form the components 610, 620 and 630 of the interconnection assembly 600 shown in FIGS. 6A through 6E may be the same as the materials used to form the components 310, 320 and 330, respectively, of the interconnection assembly 300 shown in FIG. 2.

Figure 9A:
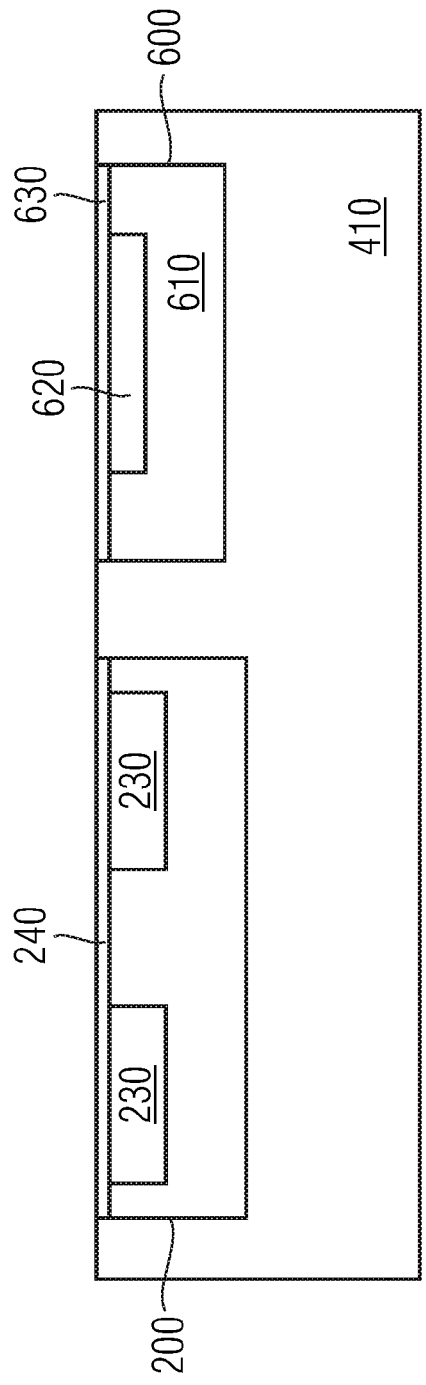
Figure 9B:
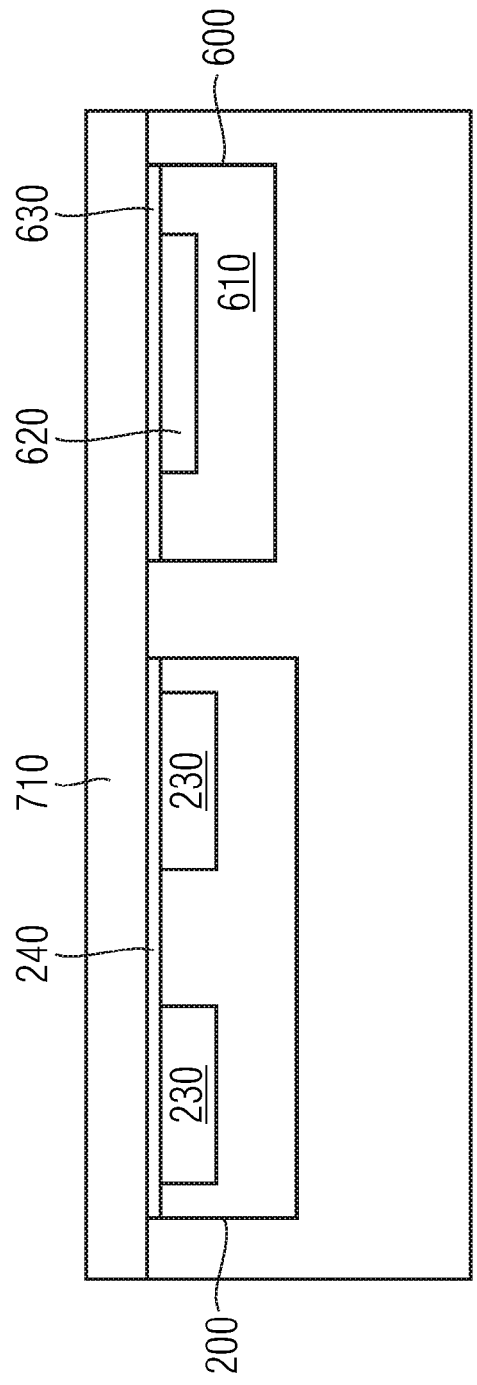

FIGS. 9A through 9G show the formation of a semiconductor structure incorporating a semiconductor chip 200 (such as the one shown in FIG. 1 and described above) and an interconnection assembly 600 (such as the one shown in FIG. 8E and described above). Referring to FIG. 9A, a semiconductor chip 200 and an interconnection assembly 600 are each disposed within a support 410 (which may be formed using a molding compound). Referring to FIG. 9B, a dielectric layer 710 is disposed over the structure from FIG. 9A. The dielectric layer 710 may comprise any dielectric material including, for example, oxide, nitride, oxynitride, imide, etc. As shown in FIG. 9C, openings 720 are formed through the dielectric layer 710 to expose the passivation layer 240 of chip 200 as well as up to expose the dielectric layer 630 of interconnection assembly 600. The openings 720 overlie two different electrically isolated portions of the final metal layer 230 of chip 200 as well as the conductive interconnect 620 of the interconnection assembly 600. The openings 720 are then deepened and continued through the passivation layer 240 of chip 200 and the through the dielectric layer 630 of interconnection assembly 600. The deepened openings are shown as openings 725 in FIG. 9D.

Referring to FIG. 9E, a seed layer 740 is then substantially conformally deposited into the openings 725 (shown in FIG. 9D) as well as over the upper surfaces of layer 710. Hence, the seed layer 740 is deposited over sidewall surfaces of dielectric layer 710 and passivation layer 240. The seed layer 740 is also deposited over upper surfaces of final metal layer 230 as well as over upper surfaces of conductive interconnect 620. An optional barrier layer (not shown) may be conformally deposited into the openings 725 and over layer 710 before depositing the seed layer 740. The seed layer 740 may be formed of a conductive material. In one or more embodiments, the seed layer 740 may be formed of a metallic material. The metallic material may include one or more of the elements Cu, Al, W, Au or Ag. In one or more embodiments, the metallic material may include the element C (carbon).

As shown in FIG. 9F, a resist process may then be used to define a redistribution layer. The resist 750 is deposited and then patterned using photolithographic and etch techniques. This is followed by the deposition of a redistribution layer material 500 in the openings created by removing (e.g. etching away) portions of the photoresist 750. As noted above, the redistribution layer material may be a conductive material. The conductive material may be a metallic material. For example, the metallic material may include one or more of the elements Cu, Al, W, Au or Ag. In one or more embodiments, the metallic material may include the element C (carbon). In one or more embodiments, the redistribution layer material may be deposited by an electroplating process, electrochemical deposition process process or an electrofill process which may make use of the seed layer. This may be particularly useful when the redistribution layer comprises the element Cu such as a pure copper material or a copper alloy material. It may be useful for other metallic materials as well.

Figure 9G:
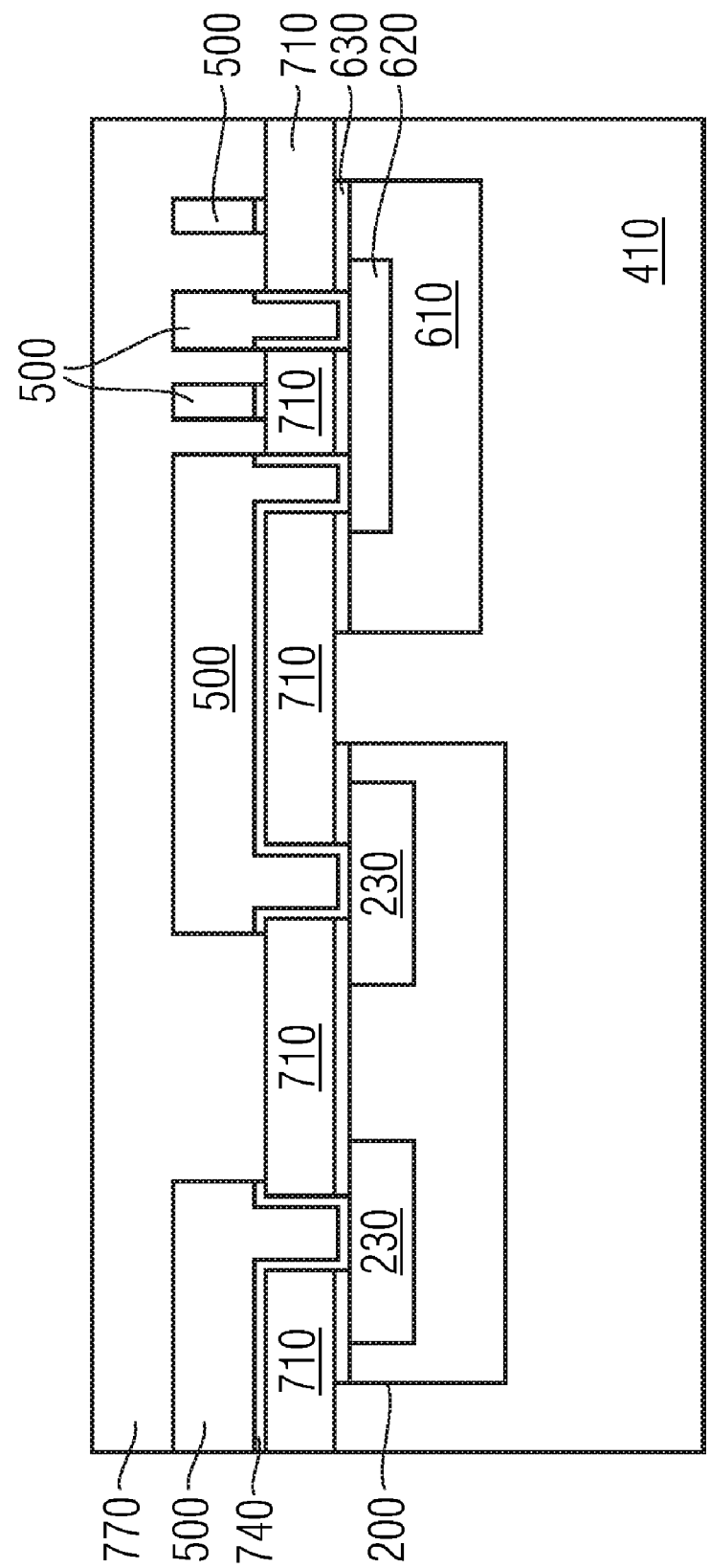

Referring to FIG. 9G, the resist 750 is then removed (for example, by a resist strip). This may be followed by a subsequent removal (for example, by dry or wet etching) of the seed layer 740 and the optional barrier layer which is on the upper surface of the dielectric layer 710 between portions of the redistribution layer material 500. This is followed by the deposition of a dielectric layer 770 over the redistribution layer 500 as well as in the vacancies left by etching the resist. Referring to FIG. 9H, the openings 780 are then formed in the dielectric layer 770 to expose upper surfaces of the redistribution layer 500. The exposed regions may define pad openings for a final device. The final device may utilize a wafer level ball package.

In one or more embodiments, it is possible to use a conductive interconnect (such as conductive interconnect 620 shown in FIG. 9H) without the use of the remaining portions of an interconnection assembly. In another embodiment of the invention, the structure is similar to that shown in FIG. 9H except that the conductive interconnect 620 is embedded within the support 410 without the use of additional pieces of the interconnection assembly such that the top surface of the conductive interconnect is exposed. In one or more embodiments, the conductive interconnect may be a metallic plate or some other form of metallic pathway. Generally, a conductive interconnect may be at least partially embedded within a support (such as, for example, a molding compound).

In another embodiment of the invention the conductive interconnect is embedded within the support such that the support material (e.g. the molding material) covers at least a portion of the top surface of the conductive interconnect. Openings or vias are introduced to expose spacedly disposed portions of the top surface.

Referring again to the embodiment shown in FIGS. 7A,B it is seen that the conductive interconnect 320 forms an underpass whereby a portion of the redistribution layer 500 crosses over it. In another embodiment, it is possible to form a conductive interconnect which is an overpass whereby a portion of the redistribution layer crosses under it. As an example, it may be possible to form a conductive interconnect from a conductive material which is above the redistribution layer. This higher level material may be a higher level redistribution layer.

In one or more embodiments, in a downstream processing step, after the individual structures on a reconfigured wafer are completed, the wafer may be singulated to form individual and separated semiconductor devices. The singulation process may be performed, for example, by mechanical means such as with the use of a saw, thermal means such as with the use of a laser, by chemical means or by any other means.

It is to be understood that the disclosure set forth herein is presented in the form of detailed embodiments described for the purpose of making a full and complete disclosure of the present invention, and that such details are not to be interpreted as limiting the true scope of this invention as set forth and defined in the appended claims.

What is claimed is:

1. A semiconductor structure, comprising:
   a semiconductor chip;
   a conductive layer comprising at least a first conductive pathway and a second conductive pathway spacedly disposed from said first conductive pathway, said first conductive pathway electrically coupled to said chip, at least a portion of said first conductive pathway disposed outside the lateral boundary of said chip, at least a portion of said second conductive pathway disposed outside the lateral boundary of said chip; and a conductive interconnect disposed outside the lateral boundary of said chip, said conductive interconnect electrically coupling said first conductive pathway to said second conductive pathway, said conductive interconnect electrically coupled to said first conductive pathway at a first area of contact, said conductive interconnect electrically coupled to said second conductive pathway at a second area of contact, a portion of said conductive layer crossing over said conductive interconnect between said first area of contact and said second area of contact.

2. The structure of claim 1, further comprising a support, said chip being at least partially embedded within said support, said conductive interconnect being at least partially embedded within said support.

3. The structure of claim 1, wherein at least a portion of said conductive layer is a redistribution layer.

4. The structure of claim 1, wherein at least a portion of said conductive layer is an inductor coil.

5. The structure of claim 4, wherein said inductor coil comprises at least a portion of said first conductive pathway and at least a portion of said second conductive pathway.

6. The structure of claim 1, wherein said conductive layer comprises a metallic material.

7. The structure of claim 1, wherein said semiconductor chip comprises a final metal layer, said conductive layer being electrically coupled to said final metal layer.

8. A semiconductor structure, comprising:
a support;
a semiconductor chip at least partially embedded within said support;
a redistribution layer electrically coupled to said chip, said redistribution layer comprising at least a first conductive pathway and a second conductive pathway spacedly disposed from said first conductive pathway; and
a conductive interconnect at least partially embedded within said support outside the lateral boundary of said chip, said conductive interconnect electrically coupling said first conductive pathway to said second conductive pathway, said conductive interconnect electrically coupled to said first conductive pathway at a first area of contact, said conductive interconnect electricity coupled to said second conductive pathway at a second area of contact, a portion of said redistribution layer crossing over said conductive interconnect between said first area of contact and said second area of contact.

9. The structure of claim 8, wherein said cross-over portion is part of said second conductive pathway.

10. The structure of claim 8, wherein said redistribution layer comprises a third conductive pathway spacedly disposed from said first conductive pathway and spacedly disposed from said second conductive pathway, said cross-over portion being part of said third conductive pathway.

11. The structure of claim 8, wherein at least a portion of said redistribution layer forms an inductor, said inductor comprising at least a portion of said first conductive pathway and at least a portion of said second conductive pathway.

12. The structure of claim 8, wherein said redistribution layer comprises a metallic material.

13. A semiconductor structure, comprising:
a support;
a semiconductor chip at least partially embedded within said support;
a conductive region electrically coupled to said chip, said conductive region overlying said support outside the lateral boundary of said chip, said conductive region comprising at least a first portion and a second portion spacedly disposed from said first portion; and
a conductive interconnect at least partially embedded within said support outside the lateral boundary of said chip, said conductive interconnect electrically coupling said first portion to said second portion, said conductive interconnect electrically coupled to said first portion at a first area of contact, aid conductive interconnect electrically coupled to said second portion at a second area of contact, a portion of said conductive region crossing over said conductive interconnect between said first area of contact and said second area of contact.

14. The semiconductor structure of claim 13, wherein said conductive region is an inductor coil.

15. The semiconductor structure of claim 14, wherein said inductor coil is a spiral inductor coil.

16. The semiconductor structure of claim 13, wherein said conductive region comprise a metallic material.

* * * * *